(12) United States Patent
Shinto

(10) Patent No.: US 8,598,782 B2
(45) Date of Patent: Dec. 3, 2013

(54) ORGANIC ELECTROLUMINESCENT DEVICE AND ELECTRONIC APPARATUS

(75) Inventor: Susumu Shinto, Chino (JP)

(73) Assignee: Seiko Epson Corporation, Tokyo (JP)

( * ) Notice: Subject to any disclaimer, the term of this patent is extended or adjusted under 35 U.S.C. 154(b) by 484 days.

(21) Appl. No.: 12/422,586

(22) Filed: Apr. 13, 2009

(65) Prior Publication Data

US 2009/0261720 A1     Oct. 22, 2009

(30) Foreign Application Priority Data

Apr. 22, 2008     (JP) .................................. 2008-111021

(51) Int. Cl.
*H01J 1/62*     (2006.01)

(52) U.S. Cl.
USPC ......................................................... 313/504

(58) Field of Classification Search
USPC ................ 313/500, 501, 503, 504, 505, 506; 445/23–25
See application file for complete search history.

(56) References Cited

U.S. PATENT DOCUMENTS

| | | | |
|---|---|---|---|
| 6,781,162 B2 | 8/2004 | Yamazaki et al. | |
| 7,265,391 B2 | 9/2007 | Yamazaki et al. | |
| 7,692,186 B2 | 4/2010 | Yamazaki et al. | |
| 7,851,996 B2 | 12/2010 | Nakamura et al. | |
| 8,089,066 B2 | 1/2012 | Yamazaki et al. | |
| 2003/0197466 A1* | 10/2003 | Yamazaki et al. | 313/504 |
| 2005/0275339 A1* | 12/2005 | Seo et al. | 313/503 |
| 2012/0097994 A1 | 4/2012 | Yamazaki et al. | |

FOREIGN PATENT DOCUMENTS

| | | |
|---|---|---|
| JP | A-2003-123988 | 4/2003 |
| JP | A-2003-288994 | 10/2003 |
| JP | A-2007-164162 | 6/2007 |

* cited by examiner

*Primary Examiner* — Anh Mai
*Assistant Examiner* — Brenitra M Lee
(74) *Attorney, Agent, or Firm* — Oliff & Berridge, PLC

(57) ABSTRACT

An organic electroluminescent device includes a pixel region in which a plurality of pixels is disposed on a support substrate, each pixel having an electroluminescent element in which at least a first electrode layer, a light-emitting layer, and a second electrode layer are laminated in that order at an upper layer side of an insulating film; a first conductive pattern portion provided at a lower layer side of the insulating film for applying a potential to the second electrode layer; and a second conductive pattern portion which is composed of a conductive film having a sheet resistance lower than that of the second electrode layer and which is provided at the upper layer side of the insulating film to connect the second electrode layer to the first conductive pattern portion. In this organic EL device, the second conductive pattern portion has a third conductive pattern portion which is provided on an upper surface of the first conductive pattern portion at a contact portion composed of a non-forming region of the insulating film and which is in contact with the first pattern portion.

4 Claims, 22 Drawing Sheets

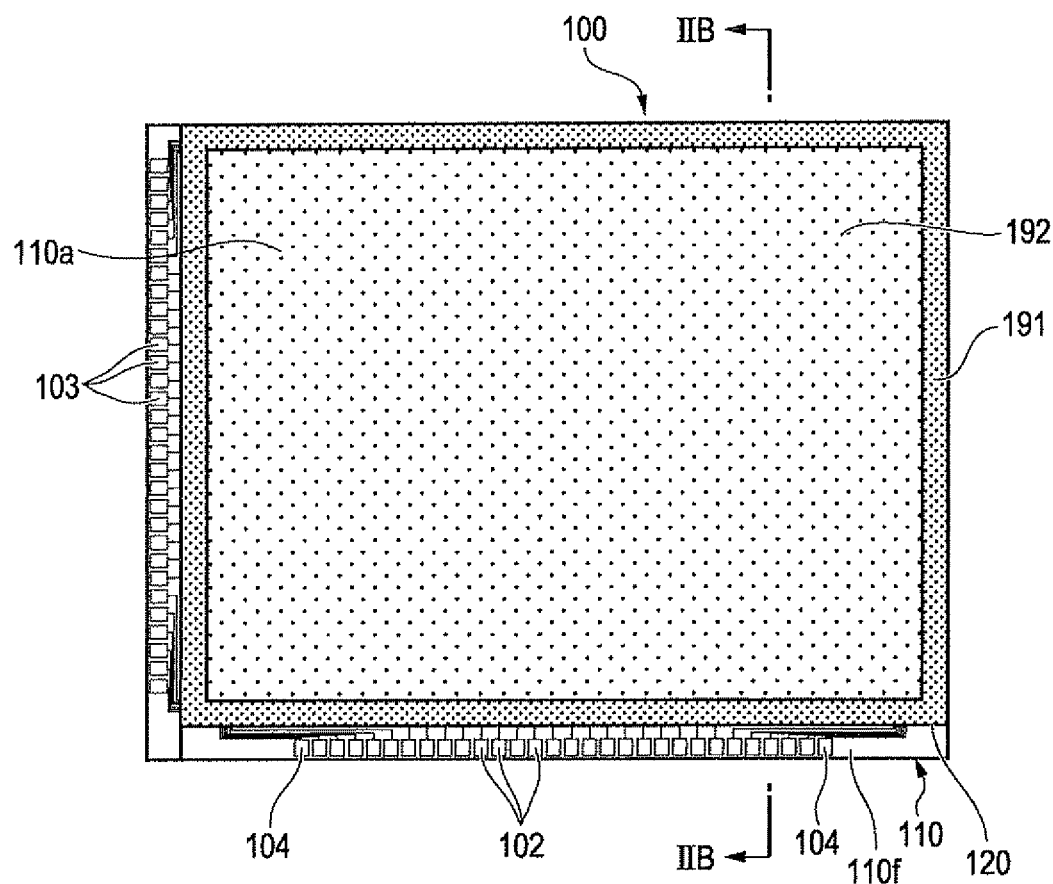
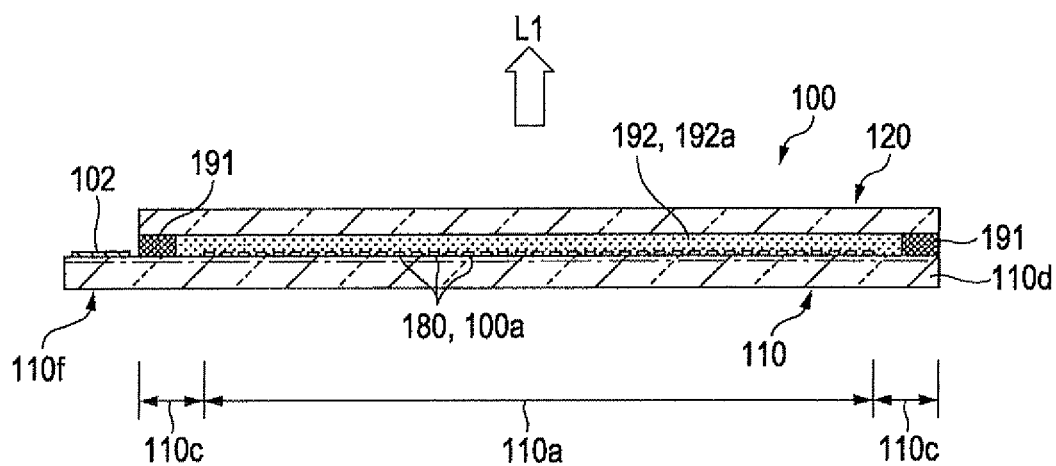

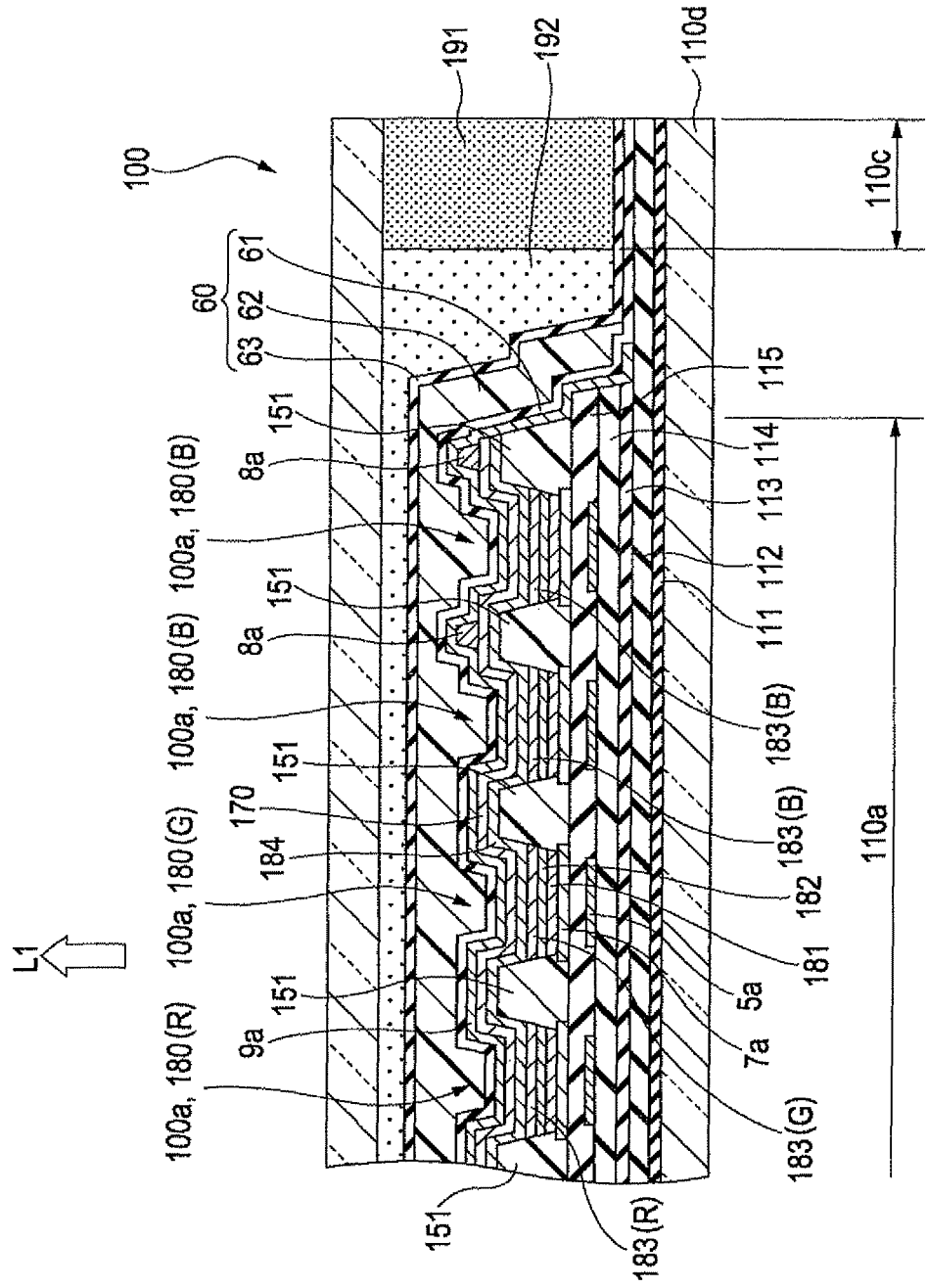

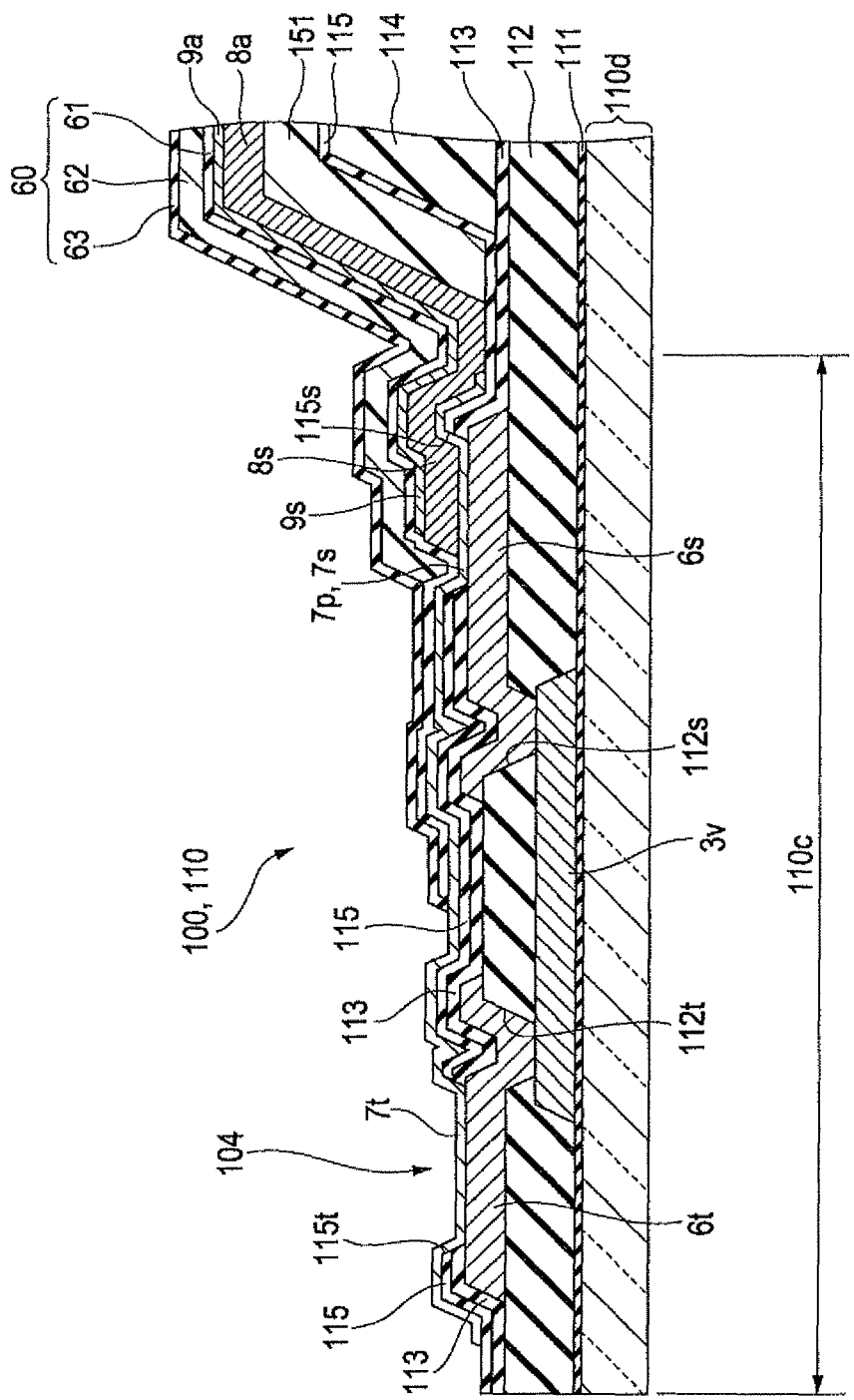

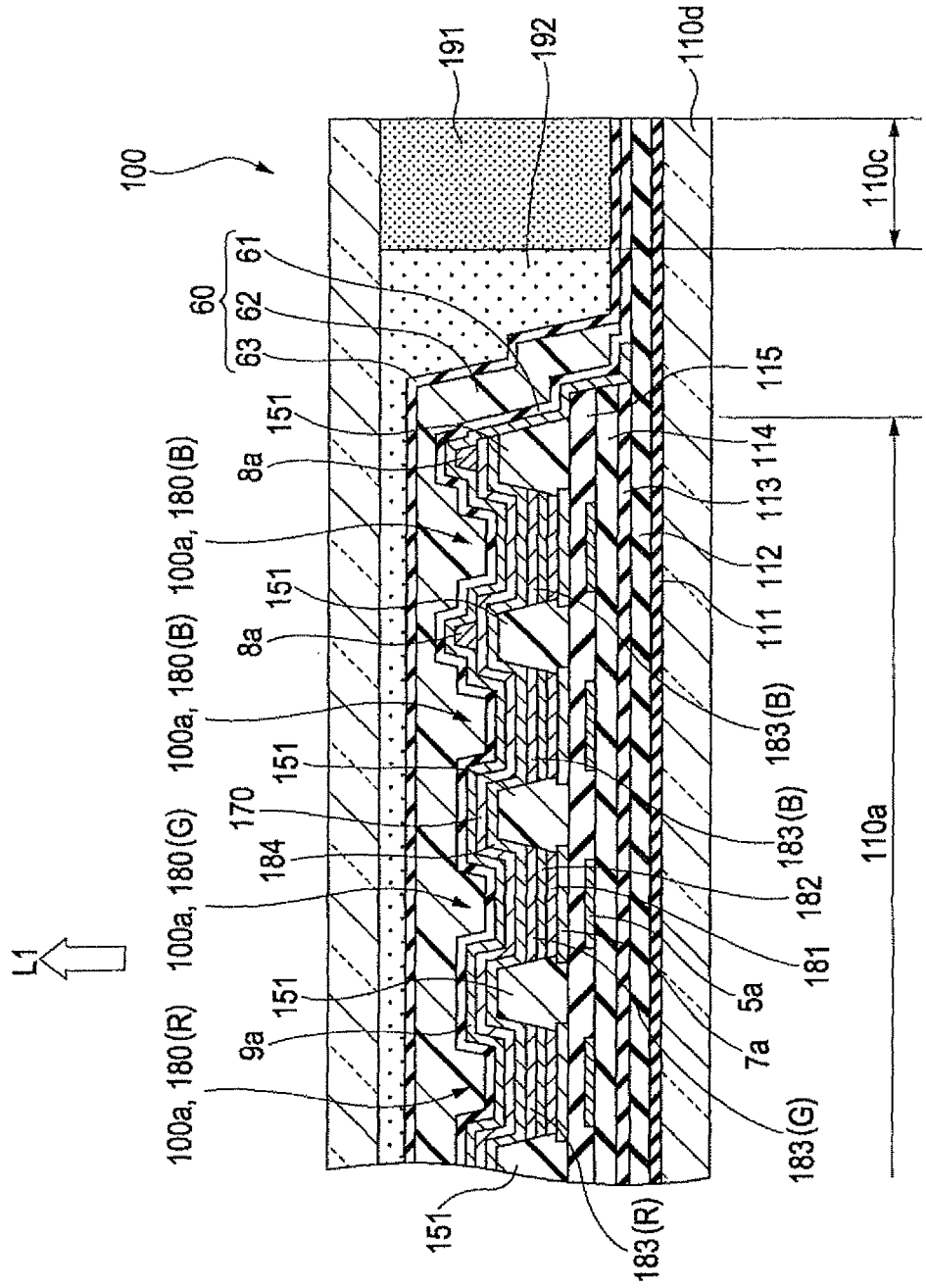

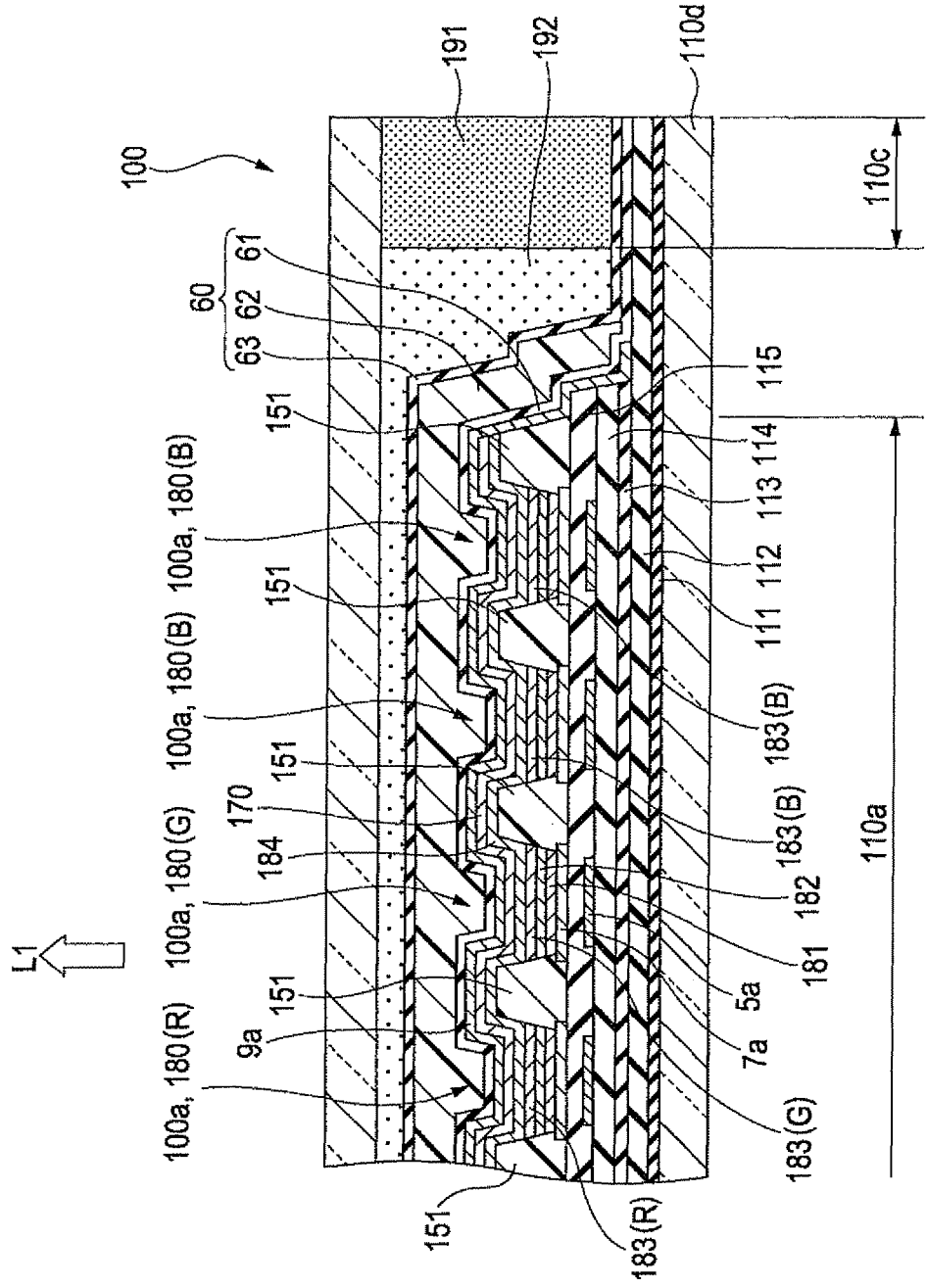

ORGANIC ELECTROLUMINESCENT DEVICE AND ELECTRONIC APPARATUS

BACKGROUND

1. Technical Field

The present invention relates to an organic electroluminescent device (hereinafter referred to as an "organic EL device") including organic electroluminescent elements (hereinafter referred to as "organic EL elements") provided on a support substrate and an electronic apparatus including the above organic El device.

2. Related Art

Organic EL devices each have a pixel region in which a plurality of pixels is arranged on a support substrate, and in each of the plurality of pixels, an organic EL element is formed which includes at least a first electrode layer, a light-emitting layer, and a second electrode layer provided in that order at an upper layer side of an insulating film. Among the organic EL devices as described above, in particular, in a top emission-type organic EL device in which light emitted from an organic EL element is emitted through a second electrode layer, since the second electrode layer is required to have light transparency, the thickness thereof is small, and as a result, luminescent variation caused by electrical resistance of the second electrode layer is liable to generate.

Accordingly, as shown in FIGS. 13A and 13B, a technique to prevent luminescent variation caused by electrical resistance of a second electrode layer $9a$ has been proposed in which auxiliary wires $8a$ are formed at an upper layer side or a lower layer side of the second electrode layer $9a$ in regions located between adjacent pixels $100a$ (for example, see JP-A-2003-123988).

A potential is applied to the auxiliary wires $8a$ and the second electrode layer $9a$ through terminals 104 and the like, and lower layer-side conductive pattern portions $6s$ for applying a potential to the auxiliary wires $8a$ and the second electrode layer $9a$ are electrically connected to the respective terminals 104 at a lower layer side of an insulating film 113. Hence, in general, the structure is used in which a contact portion $113r$ is formed of a non-forming region of the insulating film 113, and end portions of the auxiliary wires $8a$ are provided on an upper surface of the lower layer-side conductive pattern portion $6s$ so that the auxiliary wires $8a$ are connected thereto.

However, since the auxiliary wire $8a$ is formed in a region located between the adjacent pixels $100a$ to have a small width, in order to reduce connection resistance by increasing an overlapped area between the auxiliary wire $8a$ and the lower layer-side conductive pattern portion $6s$, a length L of an overlapped portion between the auxiliary wire $8a$ and the lower layer-side conductive pattern portion $6s$ must be increased; hence, in the structure shown in FIGS. 13A and 13B, a width dimension W50 of the contact portion $113r$ must be increased. Accordingly, in a support substrate $110d$, a peripheral region $100c$, which is not directly responsible for display, is formed to have a large width dimension at an outer side of a pixel region $110a$, and as a result, the size of the support substrate $110d$ is disadvantageously increased with respect to the area of the pixel region $110a$.

In addition, also in the case in which the auxiliary wires $8a$ are not formed, and the second electrode layer $9a$ is directly provided on the upper surface of the lower layer-side conductive pattern portion $6s$ so as to directly and electrically connect the second electrode layer $9a$ thereto, the width dimension W50 of the contact portion $113r$ must be disadvantageously increased as in the case described above.

In addition, in the case of a bottom emission-type organic EL device in which light emitted from an organic EL element is emitted from a support substrate side, the problem described above is also generated when the thickness of the second electrode layer $9a$ is small, and the electrical resistance thereof is large.

SUMMARY

An advantage of some aspects of the invention is to provide an organic EL device in which an electrode layer of organic EL elements formed at an upper layer side of an insulating film and a conductive film pattern formed at a lower layer side thereof can be reliably connected to each other without increasing the area of a contact portion electrically connecting the electrode layer and the conductive film pattern and is to provide an electronic apparatus including the above organic EL device.

In order to gain the above advantage, in accordance with a first aspect of the invention, there is provided an organic EL device including: a pixel region in which a plurality of pixels is disposed on a support substrate, each pixel having an organic EL element in which at least a first electrode layer, a light-emitting layer, and a second electrode layer are laminated in that order at an upper layer side of an insulating film; a first conductive pattern portion provided at a lower layer side of the insulating film for applying a potential to the second electrode layer; and a second conductive pattern portion which is composed of a conductive film having a sheet resistance lower than that of the second electrode layer and which is provided at the upper layer side of the insulating film to connect the second electrode layer to the first conductive pattern portion. In this organic EL device, the second conductive pattern portion has a third conductive pattern portion which is provided on an upper surface of the first conductive pattern portion at a contact portion composed of a non-forming region of the insulating film and which is in contact with the first pattern portion.

According to the first aspect of the invention, since the first conductive pattern portion for applying a potential to the second electrode layer is formed at the lower layer side of the insulating film, and the second conductive pattern portion for connecting the second electrode layer to the first conductive pattern portion is formed from a conductive film having a sheet resistance lower than that of the second electrode layer at the upper layer side of the insulating film, a potential can be applied to the second electrode layer through the first and the second conductive pattern portions. In this case, since the second conductive pattern portion has the third conductive pattern portion which is provided on the upper surface of the first conductive pattern portion at the contact portion, the connection resistance between the first conductive pattern portion and the second conductive pattern portion is low without excessively increasing the size of the contact portion. In addition, since the second conductive pattern portion is formed at the upper layer side of the insulating film, the second electrode layer can also be electrically connected to the second conductive pattern portion outside the contact portion directly or indirectly through the auxiliary wires. Hence, in both cases in which the second electrode layer is directly and electrically connected to the second conductive pattern portion and in which the second electrode layer is electrically connected to the second conductive pattern portion through the auxiliary wires, the second electrode layer can be reliably and electrically connected to the first conductive pattern portion without excessively increasing the area of the contact portion; hence, the area of a peripheral region, which is located outside the pixel region and which is not directly responsible for display, may be small.

The organic EL device according to the first aspect of the invention is effectively applied to the case in which light emitted from the organic EL element is emitted through the second electrode layer.

The above organic EL device preferably further comprises auxiliary wires which are in contact with the second electrode layer at a lower layer side or an upper layer side thereof and which extend between the pixels adjacent to each other, and in this case, end portions of the auxiliary wires are preferably provided on an upper surface of the third conductive pattern portion of the second conductive pattern portion and are in contact with the third conductive pattern portion.

In the case described above, it is preferable that a connection electrode portion having a width larger than that of each of the auxiliary wires be formed at the end portions thereof and that the connection electrode portion be provided on the upper surface of the third conductive pattern portion of the second conductive pattern portion and be in contact with the third conductive pattern portion.

According to another embodiment of the invention, the structure may be used in which auxiliary wires in contact with the second electrode layer extend between the pixels adjacent to each other at a lower layer side or an upper layer side of the second electrode layer, and in which the second conductive pattern portion is integrally formed with the auxiliary wires at end portions thereof.

According to still another embodiment of the invention, the structure may be used in which an end portion of the second electrode layer is provided on an upper surface of the third conductive pattern portion of the second conductive pattern portion and is in contact with the third conductive pattern portion.

In the organic EL device according to the first aspect of the invention, the second conductive pattern portion is preferably formed of the same layer as that for the first electrode layer. By the above structure, without adding a new conductive film, the second conductive pattern portion can be formed.

An organic EL device according to a second aspect of the invention may be used as a display portion of an electronic apparatus, such as a mobile computer or a mobile phone; an exposure head of an electronic apparatus such as an image-forming device; and a light-source device for various electronic apparatuses.

BRIEF DESCRIPTION OF THE DRAWINGS

The invention will be described with reference to the accompanying drawings, wherein like numbers reference like elements.

FIG. 2A is a plan view of an organic EL device of an embodiment of the invention when viewed from a second substrate (sealing substrate) side.

FIG. 2B is a cross-sectional view taken along the line IIB-IIB shown in FIG. 2A.

FIG. 3A is a schematic cross-sectional view of an organic EL device according to Embodiment 1 of the invention.

FIG. 5B is a cross-sectional view taken along the line VB-VB shown in FIG. 5A.

FIG. 6A is a schematic cross-sectional view of an organic EL device according to Embodiment 2 of the invention.

FIG. 10A is a schematic cross-sectional view of an organic EL device according to Embodiment 4 of the invention.

DESCRIPTION OF EXEMPLARY EMBODIMENTS

Figure 13A:
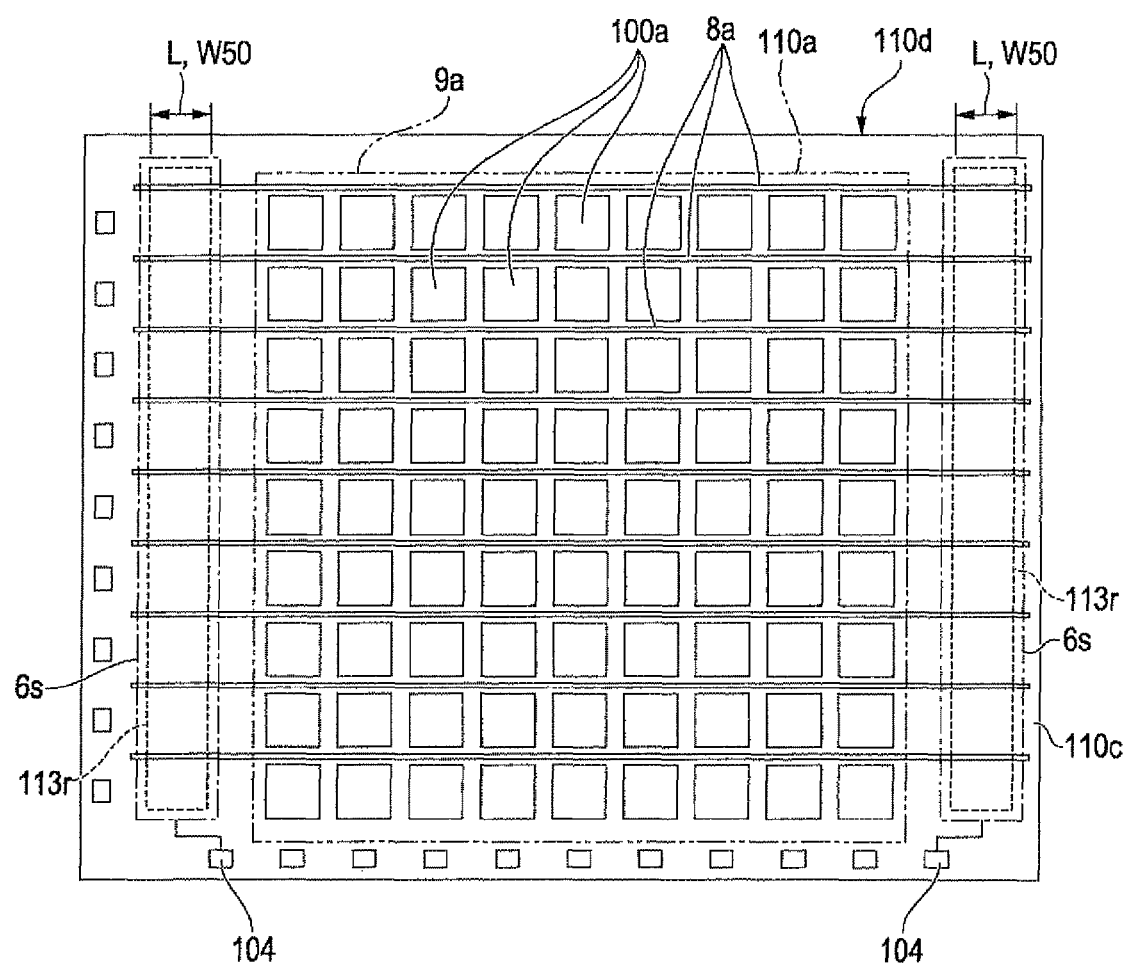
FIGS. 13A and 13B are views each illustrating a related organic EL device.
Figure 13B:
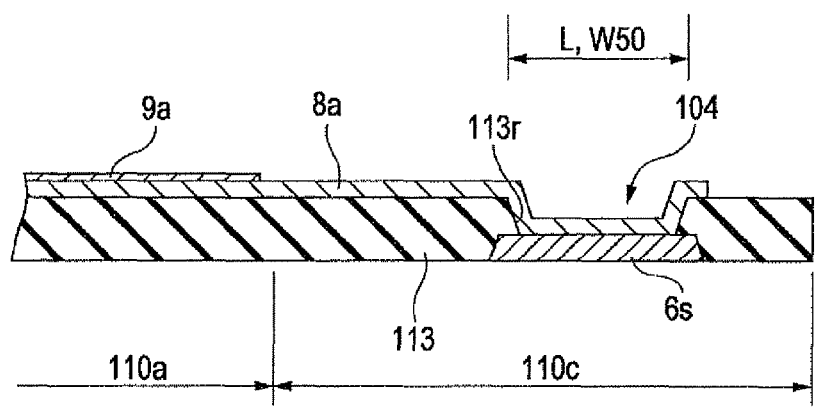

With reference to the drawings, an organic EL device of an embodiment of the invention will be described. In the drawings used for illustration, in order to recognize constituent elements in the drawings, the scale reductions of the constituent elements are made different whenever necessary. In addition, in order to facilitate understanding of correspondence relationship between constituent elements, in the following description, elements corresponding to the elements described with reference to FIGS. 13A and 13B are designated by the same reference numerals.

Embodiment 1

Figure 1:
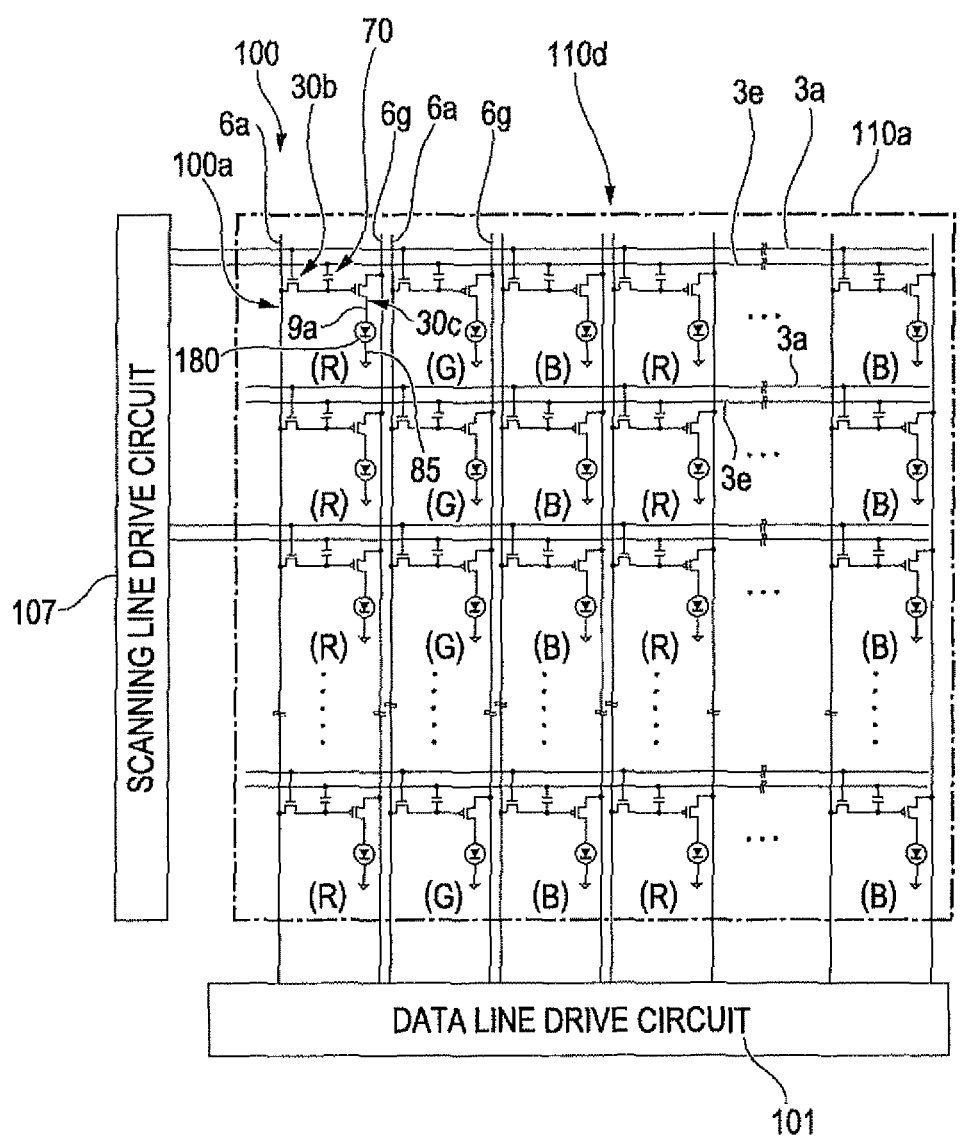
FIG. 1 is a block diagram showing an electrical structure of an organic EL device of an embodiment of the invention.

FIG. 1 is a block diagram showing an electrical structure of an organic EL device of the invention. FIG. 2A is a plan view of an organic EL device of the invention when viewed from a second substrate (sealing substrate) side, and FIG. 2B is a cross-sectional view taken along the line IIB-IIB shown in FIG. 2A.

An organic EL device 100 shown in FIG. 1 has a first substrate 110 used as an element substrate, a plurality of scanning lines 3a, a plurality of data lines 6a extending in a direction intersecting the scanning lines 3a, and pixels 100a provided at positions corresponding to the intersections between the scanning lines 3a and the data lines 6a, and a region in which the pixels 100a are disposed in a matrix forms a pixel region 110a.

In addition, on the first substrate 110, a plurality of power lines 6g extends parallel to the data lines 6a, and a plurality of capacity lines 3e extends parallel to the scanning lines 3a. A data line drive circuit 101 is connected to the data lines 6a, and a scanning line drive circuit 107 is connected to the scanning lines 3a. In each of the pixels 100a, there are provided a switching thin film transistor 30b in which a scanning signal is supplied to its gate electrode through one scanning line 3a; a storage capacitor 70 which stores a pixel signal supplied from one data line 6a through the switching thin film transistor 30b; a drive thin film transistor 30c in which a pixel signal stored in the storage capacitor 70 is supplied to its gate electrode; and an organic EL element 180 into which a drive current is supplied from one power line 6g when the organic EL element 180 is electrically connected thereto through the thin film transistor 30c. The organic EL element 180 emits red (R), green (G), or blue (B) light, and three pixels 100a corresponding to these three colors form a sub-pixel. In this embodiment, a stripe arrangement is used in which pixels 100a which emit the same color are linearly arranged along the extension direction of the data lines 6a.

In the organic EL device 100 described above, when the scanning line 3a is driven and the switching thin film transistor 30b is turned on, a potential of the data line 6a at this moment is stored in the storage capacitor 70, and in accordance with the charge stored therein, the drive thin film transistor 30c is determined to be turned on or off. In addition, current is allowed to flow from the power line 6g to a first electrode layer 7a through the channel of the drive thin film transistor 30c, and current is allowed to flow to a second electrode layer 9a through organic functional layers. As a result, the organic EL element 180 emits light in accordance with the amount of current flowing therethrough.

In the structure shown in FIG. 1, although the power lines 6g and the capacity lines 3e extend from the data line drive circuit 101 and the scanning lines drive circuit 107, respectively, since constant potentials are applied to the lines 6g and 3e, the structure may be used in which the power lines 6g and the capacity lines 3e directly extend from terminals which will be described later. In addition, in the structure shown in FIG. 1, although the capacity lines 3e are formed parallel to the scanning lines 3a, instead of forming the capacity lines 3e, storage capacitors 70 may be each formed between the power line 6g and the drain of the thin film transistor 30b.

In particular, the organic EL device 100 is formed as shown in FIGS. 2A and 2B. In FIGS. 2A and 2B, the organic EL device 100 has a first substrate 110 functioning as an element substrate and a second substrate 120 functioning as a sealing substrate, and the second substrate 120 is disposed above a surface of the first substrate 110 on which a plurality of the organic EL elements 180 is formed. The first substrate 110 and the second substrate 120 are bonded to each other with a first sealing material layer 191 and a second sealing material layer 192 provided therebetween. As shown by a region shown in FIG. 2A in which dots are densely provided, the first sealing material layer 191 is formed to have a frame shape along a peripheral region 110c which surrounds the pixel region 110a. In addition, as shown by a region shown in FIG. 2A in which dots are sparsely provided, the second sealing material layer 192 is formed in an entire region surrounded by the first sealing material layer 191.

In this embodiment, in the first substrate 110, terminals 102 and 103 are formed on a protruding region 110f protruding from the second substrate 120, and a flexible substrate (not shown) on which a drive IC incorporating the data line drive circuit 101 and the scanning line drive circuit 107 is mounted is connected to the terminals 102 and 103. In addition, in the first substrate 110, terminals 104 are formed on the protruding region 110f and are used as power supply terminals for the second electrode layer 9a.

Structure of Organic EL Element

Figure 3B:
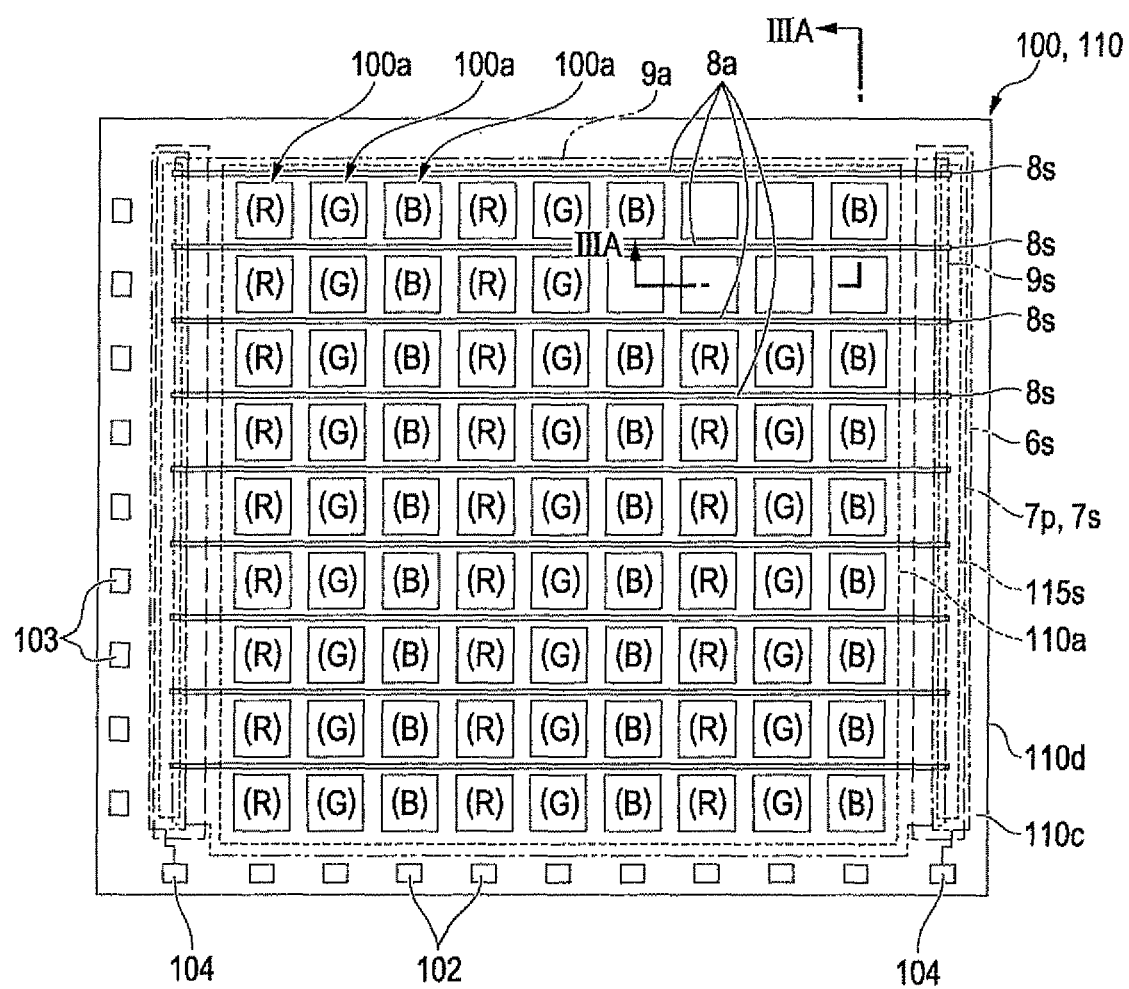
FIG. 3B is a schematic plan view of a first substrate of the organic EL device shown in FIG. 3A.
Figure 4A:
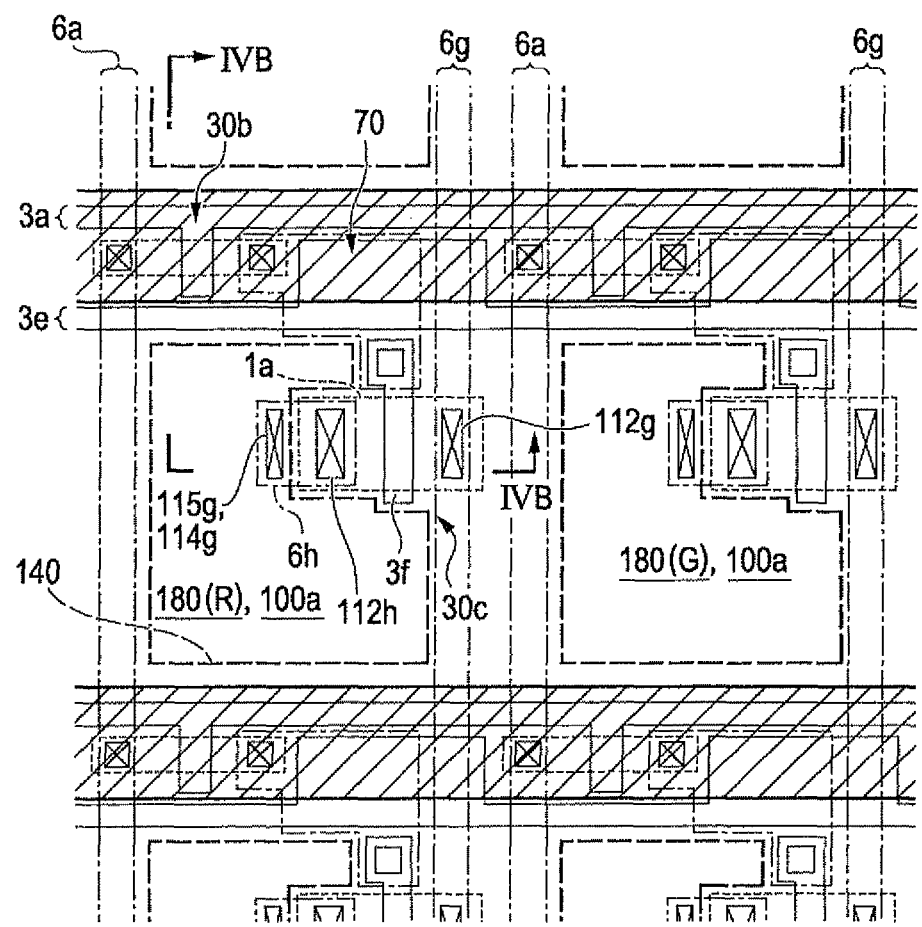
FIG. 4A is a plan view of adjacent two pixels of an organic EL device of an embodiment of the invention.
Figure 4B:
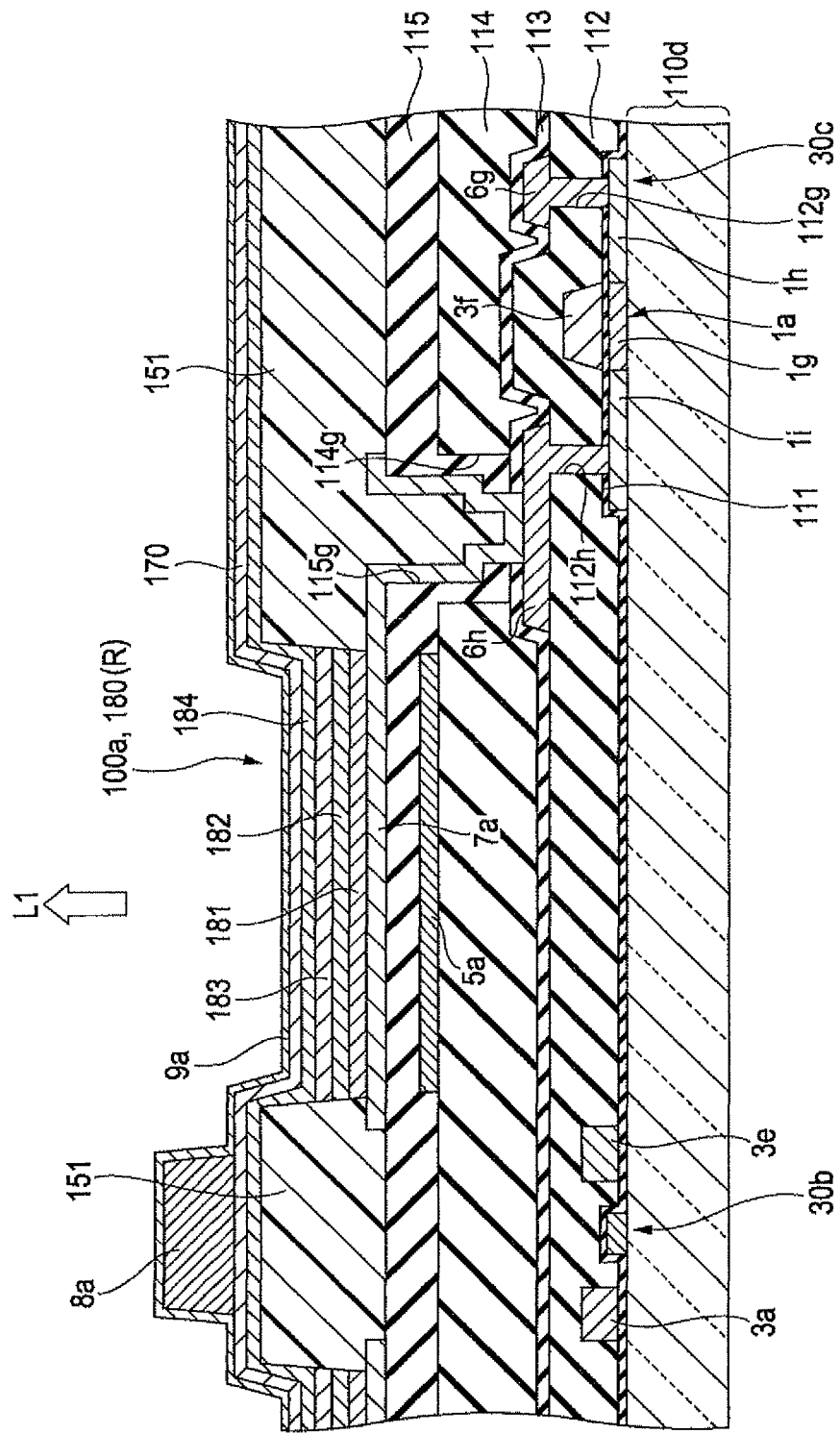
FIG. 4B is a cross-sectional view of one of the adjacent two pixels shown in FIG. 4A.

FIG. 3A is a schematic cross-sectional view of an organic EL device according to Embodiment 1 of the invention, FIG. 3B is a schematic plan view of the first substrate 110, and FIG. 3A is a cross-sectional view of the organic EL device taken along a line corresponding to the line IIIA-IIIA shown in FIG. 3B. Hence, in FIG. 3A, two organic EL elements corresponding to red color (R) and green color (G) are shown, and two organic EL elements corresponding to blue color (B) are shown. FIG. 4A is a plan view of adjacent two pixels of an organic EL device of an embodiment of the invention, and FIG. 4B is a cross-sectional view of one of the adjacent two pixels shown in FIG. 4A. FIG. 4B is a cross-sectional view taken along the line IVB-IVB shown in FIG. 4A, and in FIG. 4A, the first electrode layer 7a is shown by a long dotted line, the data line 6a and a thin film simultaneously formed therewith are shown by chain lines, the scanning line 3a is shown by solid lines, and a semiconductor layer is shown by short dotted lines. In addition, in FIG. 4A, an auxiliary wire is shown by right-up diagonal lines.

As shown in FIG. 3A, the first substrate 100 has a support substrate 110d formed, for example, of a quartz substrate, a glass substrate, a ceramic substrate, or a metal substrate. Insulating films 111, 112, 113, 114, and 115 are formed on a surface of the support substrate 110d, and organic EL elements 180 (R), (G), and (B) which emit red color (R), green color (G), and blue color (B), respectively, are formed on the insulating film 115. The organic EL device 100 of this embodiment is a top emission-type, and as shown by an arrow L1, since light is emitted from a side at which the organic EL elements 180 (R), (G), and (B) are formed when viewed from the support substrate 110d, an opaque substrate formed, for example, from ceramic, such as alumina, or stainless steel may be used as the support substrate 110d. On the other hand, a light transparent substrate, such as a quartz substrate or a glass substrate, is used as the second substrate 120. When the organic EL device 100 is a bottom emission-type, since light is emitted from the support substrate 110d side, a transparent substrate such as a glass substrate is used as the support substrate 110d. The insulating films 111, 112, 113, and 115 are each formed of a silicon oxide film or a silicon nitride film by chemical vapor deposition (CVD) or the like, and the insulating film 114 is formed as a planarizing film composed of a photosensitive resin having a thickness of 1.5 to 2.0 μm.

As shown in FIGS. 4A and 4B, for example, by using interlayers between the insulating films 111, 112, 113, and 114, thin film transistors and wires are formed to control the supply of electricity to the organic EL elements 180 (R), (G), and (B). That is, on the first substrate 110, the transparent first electrode layers 7a (pixel electrodes/anodes/regions surrounded by the long dotted lines) disposed in a matrix are formed in the respective pixels 100a in the form of an island, and along boundary regions between the first electrode layers 7a in the longitudinal and lateral directions, the data lines 6a (regions shown by the chain lines), the power lines 6g (regions shown by the chain lines), the scanning lines 3a (regions shown by the solid lines), and the capacity lines 3e (regions shown by the solid lines) are formed.

The thin film transistors 30c are formed in regions corresponding to the first electrode layers 7a at a front surface side of the support substrate 110d functioning as a base member of the first substrate 110. In the thin film transistor 30c, a channel region 1g, a source region 1h, and a drain region 1i are formed in a semiconductor layer 1a having an island shape. The insulating film 111 (gate insulating layer) is formed at a front surface side of the semiconductor layer 1a, and a gate electrode 3f is formed on the surface of the insulating film 111. The gate electrode 3f is electrically connected to the drain of the thin film transistor 30b. In addition, since the basic structure of the thin film transistor 30b is similar to that of the thin film transistor 30c, a description will be omitted.

At an upper layer side of the thin film transistor 30c, the insulating films 112 and 113 composed of a silicon oxide film or a silicon nitride film, the insulating film 114 (planarizing film) composed of a photosensitive resin having a thickness of 1.5 to 2.0 µm, and the insulating film 115 composed, for example, of a silicon nitride film are formed. The data line 6a (not shown in FIG. 4B), the power line 6g, and a drain electrode 6h are formed on the surface of the insulating film 112 (between the insulating films 112 and 113), and the power line 6g is electrically connected to the source region 1h through a contact hole 112g formed in the insulating film 112. In addition, the drain electrode 6h is electrically connected to the drain region 1i through a contact hole 112h formed in the insulating film 112. In this embodiment, the data line 6a, the power line 6g, and the drain electrode 6h are formed of a single metal film, such as a molybdenum film, an aluminum film, a titanium film, a tungsten film, a tantalum film, or a chromium film, or a laminated film thereof.

The first electrode layer 7a of a light transparent conductive film made, for example, from indium tin oxide (ITO) or indium zinc oxide (IZO) is formed on the surface of the insulating film 115 and is electrically connected to the drain electrode 6h through contact holes 114g and 115g formed in the insulating films 113, 114, and 115. The first electrode layer 7a composed of an oxide material, such as ITO, may be formed by a high-density plasma film formation method, such as an ECR plasma sputtering method, an ion plating method using a plasma gun, or a magnetron sputtering method.

Between the insulating films 114 and 115, a light reflection layer 5a is formed from aluminum, silver, or an alloy thereof by a vacuum deposition method or the like, and light emitted from the organic EL elements 180 (R), (G), and (B) to the support substrate 110d is reflected by the light reflection layer 5a, so that light can be emitted. In addition, a thick partition 151 having an opening to define a light emission region is formed from a photosensitive resin or the like on the first electrode layer 7a.

Organic functional layers, such as a hole injection layer 181, a hole transport layer 182, light-emitting layers 183 (R), (G), and (B) having different colors, and an electron transport layer 184, are formed on the first electrode layer 7a, and an electron injection layer 170 formed from LiF and the second electrode layer 9a (cathode) formed from a thin film metal, such as Al or MgAg, are laminated on the above organic functional layers. The hole injection layer 181 is formed, for example, of a triarylamine (ATP) multimer, and the hole transport layer 182 is formed, for example, of triphenyldiamine (TPD). The light-emitting layers 183 (R), (G), and (B) are formed, for example, of styrylamine-based materials (hosts) including, for example, an anthracene-based dopant or a rubrene-based dopant, and the electron transport layer 184 is formed of aluminum quinolinol ($Alq_3$) or the like. As described above, the organic EL elements 180 (R), (G), and (B) emitting red color (R), green color (G), and blue color (B), respectively, are formed. The layers described above (the hole injection layer 181, the hole transport layer 182, the light emission layers 183 (R), (G), and (B), the electron transport layer 184, the electron injection layer 170, and the second electrode layer 9a) may be sequentially formed by a vacuum deposition method. In these steps, mask deposition is performed using a metal mask or a silicon mask.

In addition, organic EL elements may be formed in some cases so as to emit white light or mixed light of red color (R), green color (G), and blue color (B), and in the case described above, when color conversion is performed in the second substrate 120 by forming color filter layers of red color (R), green color (G), and blue color (B) at positions facing the organic EL elements, full color display can be performed.

In the organic EL device 100 formed as described above, since the organic functional layers (the hole injection layer 181, the hole transport layer 182, the light emission layers 183 (R), (G), and (B), and the electron transport layer 184) are liable to be degraded by moisture, for example, an electron injection effect is degraded thereby, and as a result, a non-light-emitting portion called a dark spot is unfavorably generated. Hence, in this embodiment, as will be described with reference to FIG. 3A, the structure in which the light transparent substrate 120 is adhered as a sealing substrate to the first substrate 110 is used together with the structure in which a sealing film 60, which will be described below, is formed on the first substrate 110.

First, in the first substrate 110, the sealing film 60 having a wider region than that of the pixel region 110a is formed on the second electrode layer 9a. As the sealing film 60 described above, in this embodiment, a laminate film is used which includes a first film 61 made of a silicon compound layer laminated on the second electrode layer 9a, a second film 62 made of a resin layer laminated on the first film 61, and a third film 63 made of a silicon compound laminated on the second film 62. In this laminate film, the first film 61 and the third film 63 are formed, for example, of a silicon nitride compound ($SiN_x$) or a silicon oxynitride compound ($SiO_xN_y$) deposited by a high-density plasma vapor phase growth method using a high-density plasma source, such as ion plating using a plasma gun or ECR plasma sputtering, and even if being deposited at a low temperature, the thin films described above each function as a high-density gas barrier layer that can reliably prevent the intrusion of moisture. In addition, the second film 62 is composed of a resin layer and functions as an organic buffer layer to prevent the generation of cracks in the first film 61 and the third film 63 by planarizing surface irregularities caused by the partitions 151 and the wires.

Next, the first sealing material layer 191 having a rectangular frame shape is formed along the peripheral region 110c between the first substrate 110 and the second substrate 120. In addition, the light-transparent second sealing material layer 192 is formed in the entire region surrounded by the first sealing material layer 191, and the first substrate 110 and the second substrate 120 are bonded to each other with the first sealing material layer 191 and the second sealing material layer 192. In this embodiment, an epoxy adhesive to be cured by UV rays is used for the first sealing material layer 191. A thermosetting epoxy adhesive is used for the second sealing material layer 192.

Structure of Auxiliary Wires

As shown in FIGS. 3A, 4A, and 4B, in the organic EL device 100 according to this embodiment, the second electrode layer 9a is a thin film formed by mask deposition so as to cover a plurality of the pixels 100a, and when the electrical resistance of the second electrode layer 9a is high, or when the electrical resistance thereof locally varies, the luminance of the organic EL device 100 varies. In particular, since the organic EL device 100 of this embodiment is a top transmission type in which light emitted from the organic EL element 180 is emitted through the second electrode layer 9a, the second electrode layer 9a is required to have light transparency. Accordingly, since the thickness of the second electrode layer 9a is small, the electrical resistance thereof locally varies, and this variation in electrical resistance causes variation in luminance of the organic EL device 100.

Accordingly, in this embodiment, as shown in FIGS. 3A, 3B, 4A, and 4B, above the support substrate 110d, auxiliary wires 8a extending in one direction are formed by mask deposition at a lower layer side of the second electrode layer 9a and are in direct contact therewith. In this structure, the auxiliary wires 8a are formed above upper surface portions of the partitions 151 to extend in one direction between the pixels 100a adjacent to each other. In this embodiment, since extending between pixels 100a having the same color, the auxiliary wires 8a extend parallel to the scanning lines 3a. In addition, since extending between the pixels 100a adjacent to each other, the auxiliary wires 8a are not required to have light transparency. Hence, the auxiliary wires 8a may have a large thickness, and a material therefor is not so much limited. Accordingly, for the auxiliary wires 8a, the same metal material as that for the second electrode layer 9a, such as aluminum or silver, may be used, and in addition, for example, a single metal film, such as a molybdenum film, a titanium film, a copper film, a tungsten film, a tantalum film, or a chromium film, or a laminate film thereof may also be used.

In this embodiment, as shown in FIG. 3B, a plurality of the auxiliary wires 8a is formed independently of each other, and the end portions of each auxiliary wire 8a extend to the outside of the pixel region 110a (peripheral region 110c). In this embodiment, the width of the auxiliary wire 8a is approximately 15 μm.

Electrical Connection Structure Between Second Electrode Layer 9a and Terminal 104

Figure 5A:
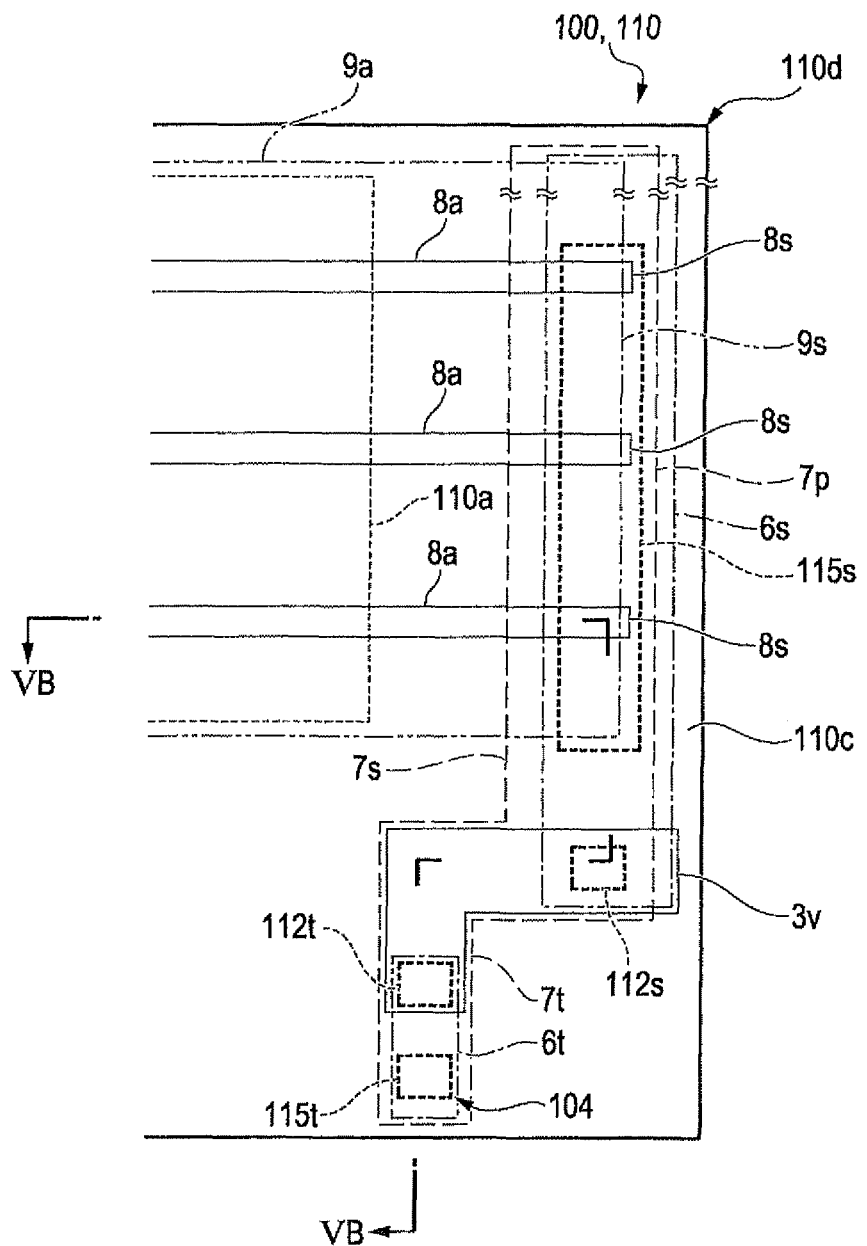
FIG. 5A is a schematic view illustrating a plan structure of an electrical connection portion between a terminal and auxiliary wires (second electrode layer) on the first substrate of the organic EL device according to Embodiment 1 of the invention.

In the organic EL device according to Example 1 of the invention, FIG. 5A is a schematic plan view of an electrical connection portion between the terminal and the auxiliary wires on the first substrate 110, and FIG. 5B is a cross-sectional view taken along the line VB-VB shown in FIG. 5A. In FIG. 5A, only three out of a great number of the auxiliary wires 8a are shown, and in FIG. 5B, the sealing resin layers, the second substrate, and the like are not shown. In addition, in FIGS. 3B and 5A, films (such as an upper layer-side conductive pattern portion used as a second conductive pattern portion) simultaneously formed with the first electrode layers 7a are shown by long dotted lines; films (such as a lower layer-side conductive pattern portion used as a first conductive pattern portion) simultaneously formed with the data lines 6a are shown by chain lines; the auxiliary wires 8a are each shown by a sold line; a contact portion is shown by a thick and short dotted line; the pixel region 110a is shown by a thin and short dotted line; and the second electrode layer 9a is shown by a two-dot chain line.

As shown in FIGS. 3B, 5A, and 5B, in the organic EL device 100 according to this embodiment, the structure is used in which the auxiliary wires 8a are electrically connected to the terminal 104 and in which the second electrode layer 9a is electrically connected to the terminal 104 through the auxiliary wires 8a. In order to realize the above structure, in this embodiment, in the vicinity of the terminal 104, a conductive film 3v composed of the same layer as that for the scanning lines 3a is formed between the insulating films 111 and 112, and a lower layer-side conductive pattern portion 6s and a lower layer-side conductive film 6t, which are composed of the same layer as that for the data lines 6s, are formed between the insulating films 112 and 113. The lower layer-side conductive pattern portion 6s and the lower layer-side conductive film 6t are electrically connected to the conductive film 3v through contact holes 112s and 112t formed in the insulating film 112 and are electrically connected to each other through the conductive film 3v.

The lower layer-side conductive film 6t is used to form the terminal 104 at an upper layer side thereof, and the lower layer-side conductive pattern portion 6s is used as a lower layer-side conductive pattern portion for electrically connecting the second electrode layer 9a and the auxiliary wires 8a to the terminal 104. Hence, a contact hole 115t is formed in the insulating films 113 and 115 which are flatly overlapped on an end portion of the lower layer-side conductive film 6t, and the upper layer-side conductive film 7t which is composed of an ITO film and which is simultaneously formed with the first electrode layers 7a is formed on the insulating film 115. As described above, the terminal 104 is formed.

In addition, in parts of the insulating films 113 and 115 which are flatly overlapped on the lower layer-side conductive pattern portion 6s, a contact portion 115s composed of a removed portion (non-forming region) of the insulating films 113 and 115 is formed, and this contact portion 115s is a large contact hole extending along the side of the pixel region 110a. An upper layer-side conductive pattern portion 7s which is composed of an ITO film or the like and which is simultaneously formed with the first electrode layer 7a is formed on the insulating film 115. This upper layer-side conductive pattern portion 7s extends to a region forming the terminal 104 along a region forming the lower layer-side conductive pattern portion 6s, a region forming the conductive film 3v, and a region forming the lower layer-side conductive film 6t. Accordingly, the upper layer-side conductive pattern portion 7s is electrically connected to the terminal 104 through the lower layer-side conductive pattern portion 6s, the conductive film 3v, and the lower layer-side conductive film 6t, which are formed at the lower layer side of the insulating film 115, and in addition, the upper layer-side conductive pattern portion 7s is also electrically connected to the terminal 104 through the upper layer-side conductive film 7t simultaneously formed with the upper layer-side conductive pattern portion 7s at the upper layer side of the insulating film 115.

In this structure, the upper layer-side conductive pattern portion 7s has a contact pattern portion 7p functioning as a third conductive pattern portion formed in a wide region including a region forming the contact portion 115s, and end portions 8s of the auxiliary wires 8a are provided on the upper surface of this contact pattern portion 7p. In this embodiment, the contact pattern portion 7p is formed to have a rectangular shape when viewed from the above. Hence, the auxiliary wires 8a are each connected to the upper layer-side conductive pattern portion 7s inside the contact portion 115s. In addition, also at the upper layer side of the insulating film 115 (outside the contact portion 115s), the end portions 8s of the auxiliary wires 8a are each provided on the upper surface of the contact pattern portion 7p of the upper layer-side conductive pattern portion 7s in a region between the contact portion 115s and the pixel region 110a and are in contact with the upper layer-side conductive pattern portion 7s. Hence, the auxiliary wires 8a are each electrically connected to the terminal 104 at the lower layer side of the insulating film 115 through the upper layer-side conductive pattern portion 7s, the lower layer-side conductive pattern portion 6s, the conductive film 3v, and the lower layer-side conductive film 6t and are also each electrically connected to the terminal 104 at the upper layer side of the insulating film 115 through the upper layer-side conductive pattern portion 7s and the upper layer-side conductive film 7t.

Furthermore, in this embodiment, the second electrode layer 9a extends to the region forming the contact portion 115s. Hence, both inside and outside the contact portion 115s, an end portion 9s of the second electrode layer 9a is provided on the upper surfaces of the end portions 8s of the auxiliary wires 8a and is in contact therewith, and in a region in which the end portions 8s of the auxiliary wires 8a are not present, the end portion 9s of the second electrode layer 9a is provided on the upper surface of the contact pattern portion 7p of the upper layer-side conductive pattern portion 7s and is in contact therewith.

Major Advantage of this Embodiment

As described above, in this embodiment, since a plurality of the auxiliary wires 8a connected to the second electrode layer 9a extends in one direction at the lower layer side of the second electrode layer 9a which is formed to cover a plurality of the pixels 100a, a high electric resistance of the second electrode layer 9a can be compensated for by the auxiliary wires 8a, and in addition, local variation in electric resistance of the second electrode layer 9a can also be absorbed by the auxiliary wires 8a. Hence, luminance variation of the organic EL device 100 can be resolved.

In addition, in this embodiment, since the lower layer-side conductive pattern portion 6s for applying a potential to the second electrode layer 9a is formed at the lower layer side of the insulating film 115, and at the upper layer side of the insulating film 115, the upper layer-side conductive pattern portion 7s for connecting the second electrode layer 9a to the lower layer-side conductive pattern portion 6s is formed using a conductive film having a sheet resistance lower than that of the second electrode layer 9a, a potential can be applied from the terminal 104 to the auxiliary wires 8a and the second electrode layer 9a through the lower layer-side conductive pattern portion 6s and the upper layer-side conductive pattern portion 7s. In this embodiment, since the upper layer-side conductive pattern portion 7s has the contact pattern portion 7p provided on the upper surface of the lower layer-side conductive pattern portion 6s at the contact portion 115s, even when the contact portion 115s is narrow, the connection resistance between the lower layer-side conductive pattern portion 6s and the upper layer-side conductive pattern portion 7s is low.

In addition, since the upper layer-side conductive pattern portion 7s is formed on the insulating film 115, the upper layer-side conductive pattern portion 7s can also be electrically connected to the auxiliary wires 8a outside the contact portion 115s, and hence the structure in which the upper layer-side conductive pattern portion 7s and the auxiliary wires 8a are in contact with each other in a sufficiently wide area can be realized. Accordingly, without excessively increasing the area of the contact portion 115s, the second electrode layer 9a can be reliably connected to the lower layer-side conductive pattern portion 6s through the auxiliary wires 8a; hence, the peripheral region 110c, which is located outside the pixel region 110a and which is not directly responsible for display, may have a small area.

Furthermore, the upper layer-side conductive pattern portion 7s and the first conductive layer 7a are simultaneously formed; hence, the upper layer-side conductive pattern portion 7s can be formed without adding a new conductive film.

Embodiment 2

Figure 6B:
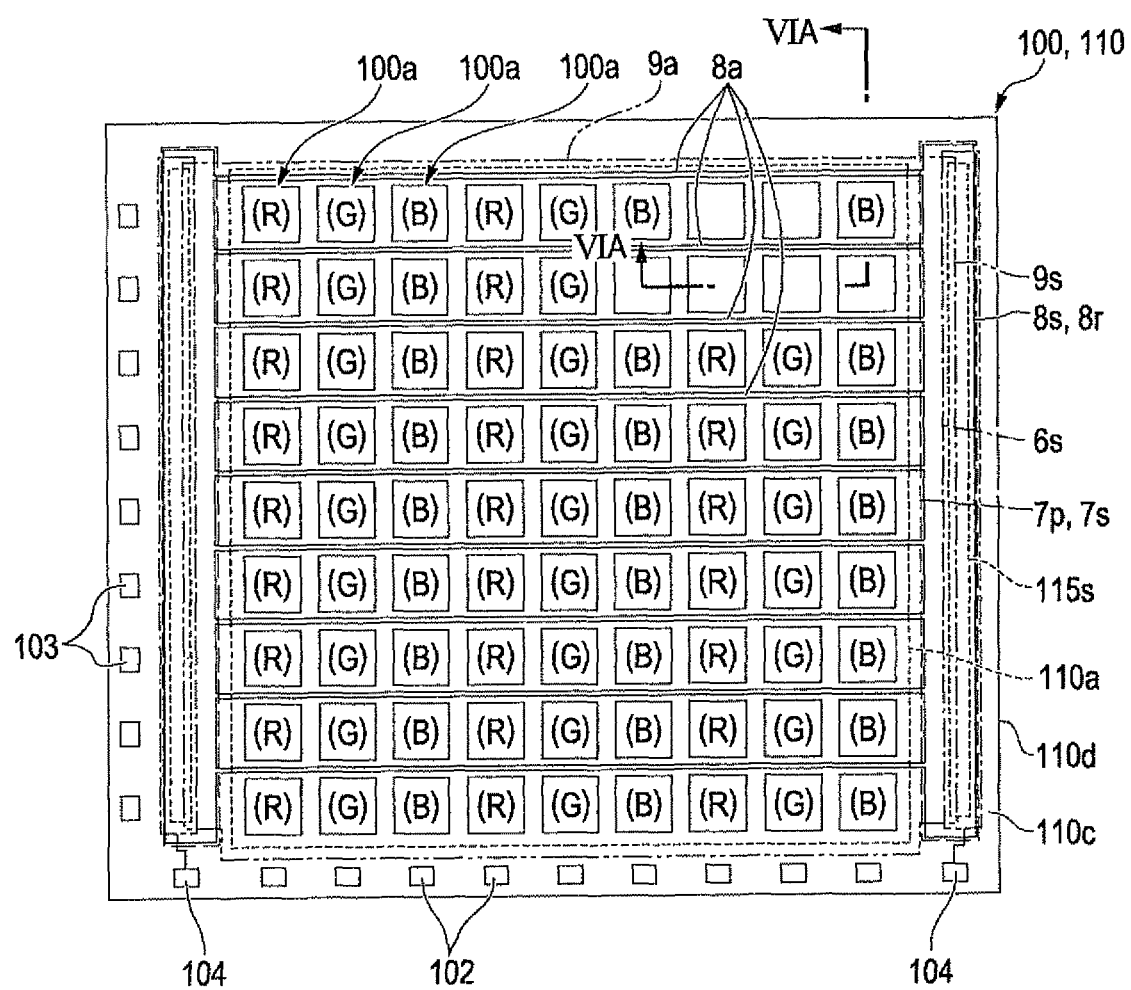
FIG. 6B is a schematic plan view of a first substrate of the organic EL device shown in FIG. 6A.
Figure 7A:
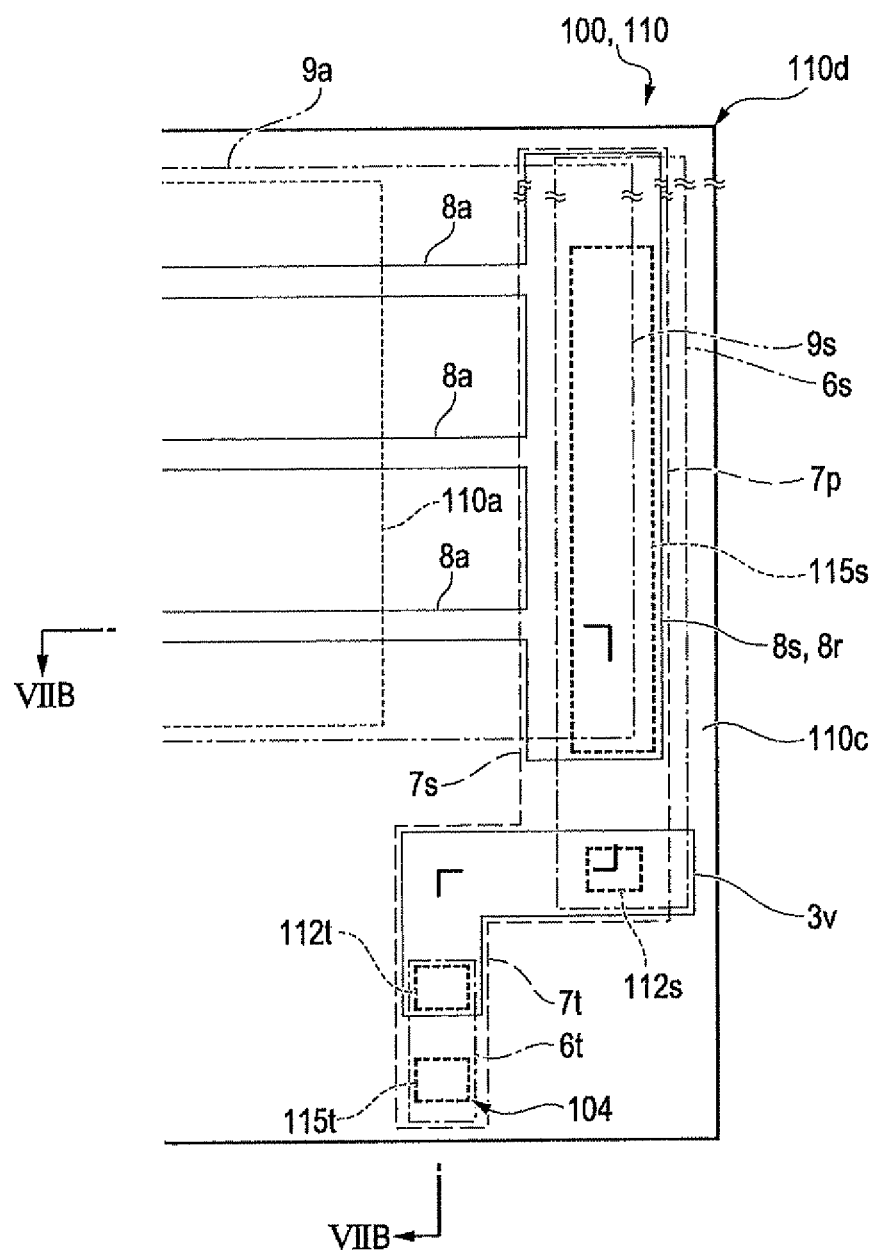
FIG. 7A is a schematic view illustrating a plan structure of an electrical connection portion between a terminal and auxiliary wires (second electrode layer) on the first substrate of the organic EL device according to Embodiment 2 of the invention.
Figure 7B:
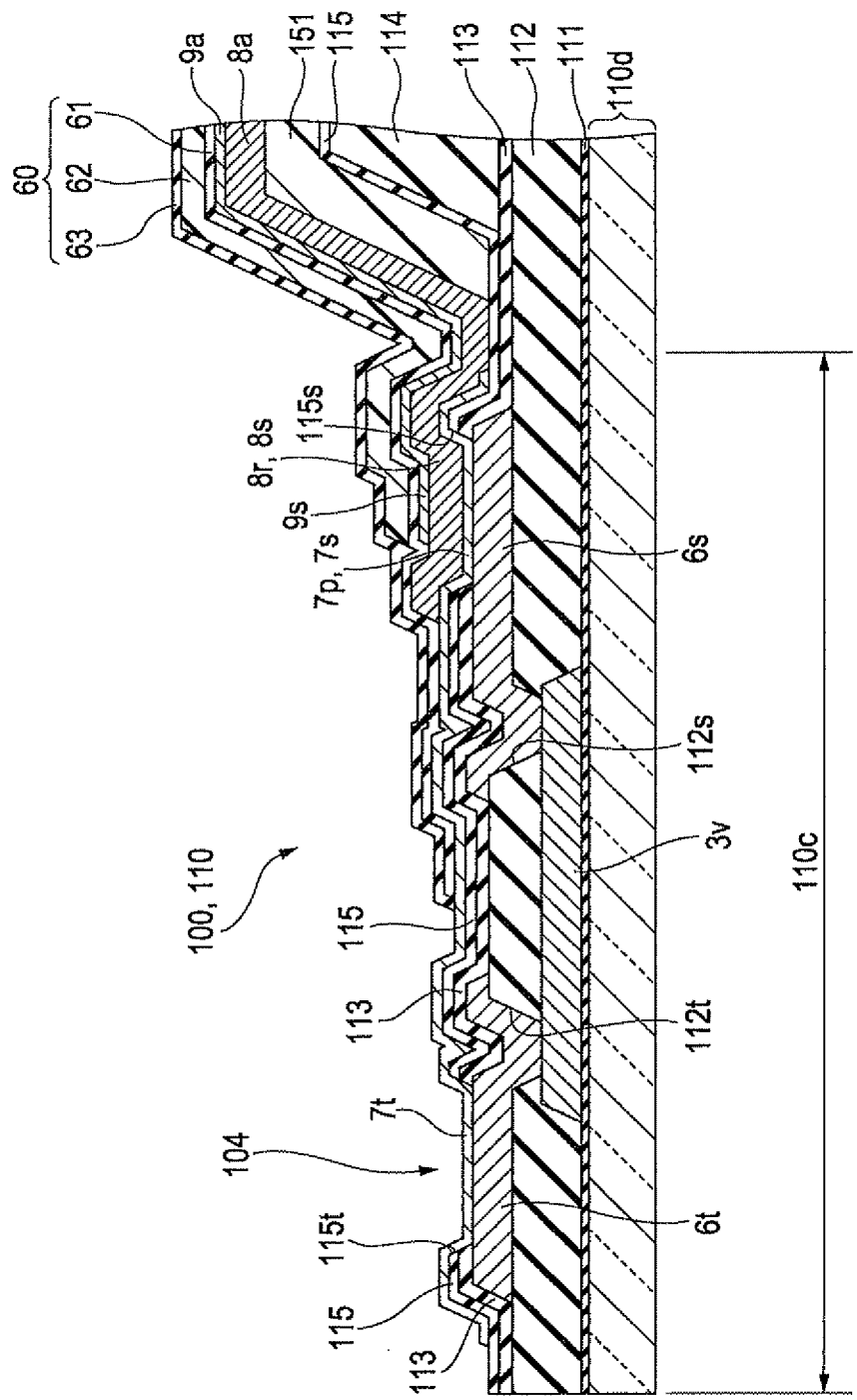
FIG. 7B is a cross-sectional view taken along the line VIIB-VIIB shown in FIG. 7A.

FIG. 6A is a schematic cross-sectional view of an organic EL device according to Embodiment 2 of the invention, and FIG. 6B is a schematic plan view of the first substrate 110 of the organic EL device shown in FIG. 6A, FIGS. 6A and 6B corresponding to FIGS. 3A and 3B, respectively, shown in Embodiment 1. FIG. 7A is a schematic view illustrating a plan structure of an electrical connection portion between a terminal and auxiliary wires (second electrode layer) on the first substrate 110 of the organic EL device according to Embodiment 2 of the invention, and FIG. 7B is a cross-sectional view taken along the line VIIB-VIIB shown in FIG. 7A, FIGS. 7A and 7B corresponding to FIGS. 5A and 5B, respectively, shown in Embodiment 1. Since the basic structure of this embodiment is similar to that of Embodiment 1, like elements are designated by the same reference numerals and a description thereof will be omitted.

As shown in FIGS. 6A, 6B 7A, and 7B, also in the organic EL device 100 of this embodiment, as in Embodiment 1, above the support substrate 110d, a plurality of the auxiliary wires 8a extending in one direction is formed at a lower layer side of the second electrode layer 9a and is in direct contact therewith. In addition, also in this embodiment, as in Embodiment 1, when the auxiliary wires 8a are electrically connected to the terminal 104, in parts of the insulating films 113 and 115 which are flatly overlapped on the lower layer-side conductive pattern portion 6s, the contact portion 115s composed of a removed portion (non-forming region) of the insulating films 113 and 115 is formed, and this contact portion 115s is a large contact hole extending along the side of the pixel region 110a. Furthermore, in this embodiment, as in Embodiment 1, the upper layer-side conductive pattern portion 7s including the contact pattern portion 7p is formed on the insulating film 115, and the contact pattern portion 7p of the upper layer-side conductive pattern portion 7s is provided on the upper surface of the lower layer-side conductive pattern portion 6s inside the contact portion 115s and is in contact with the lower layer-side conductive pattern portion 6s.

In the organic EL device 100 thus formed, in Embodiment 1, the auxiliary wires 8a are provided on the upper surface of the contact pattern portion 7p of the upper layer-side conductive pattern portion 7s while narrow widths of the auxiliary wires 8a are maintained; however, in this embodiment, the end portions 8s of the auxiliary wires 8a are connected to each other to form a solid connection electrode portion 8r having a larger width than that of each of the auxiliary wires 8a, and this connection electrode portion 8r is provided on the upper layer-side conductive pattern portion 7s inside the contact portion 115s and is in contact with the upper layer-side conductive pattern portion 7s. In addition, the end portions 8s (connection electrode portion 8r) of the auxiliary wires 8a are also provided on the upper surface of the contact pattern portion 7p of the upper layer-side conductive pattern portion 7s in a region between the contact portion 115s and the pixel region 110a and are in contact with the upper layer-side conductive pattern portion 7s.

Also in this embodiment, as in Embodiment 1, the second electrode layer 9a extends to the region forming the contact portion 115s. Hence, the end portion 9s of the second electrode layer 9a is provided on the upper surfaces of the end portions 8s (connection electrode portion 8r) of the auxiliary wires 8a in the region forming the contact portion 115s and outside the contact portion 115s and is in contact with the end portions 8s of the auxiliary wires 8a.

Also in this embodiment, as in Example 1, since the upper layer-side conductive pattern portion 7s for connecting the second electrode layer 9a to the lower layer-side conductive pattern portion 6s is formed at the upper layer side of the insulating film 115 from a conductive film having a sheet resistance lower than that of the second electrode layer 9a, the terminal 104 can apply a potential to the auxiliary wires 8a and the second electrode layer 9a through the lower layer-side conductive pattern portion 6s and the upper layer-side conductive pattern portion 7s. In this embodiment, since the upper layer-side conductive pattern portion 7s has the contact pattern portion 7p provided on the upper surface of the lower layer-side conductive pattern portion 6s in the contact portion 115s, even when the contact portion 115s is narrow, the connection resistance between the lower layer-side conductive pattern portion 6s and the upper layer-side conductive pattern portion 7s is low. In addition, since the upper layer-side conductive pattern portion 7s is formed on the insulating film 115, the upper layer-side conductive pattern portion 7s can also be electrically connected to the auxiliary wires 8a outside the contact portion 115s, and the structure in which the upper layer-side conductive pattern portion 7s and the auxiliary wires 8a are in contact with each other in a sufficiently wide area can be realized.

Furthermore, in this embodiment, the end portions 8s of the auxiliary wires 8a are connected to each other to form the solid connection electrode portion 8r having a width larger than that of each of the auxiliary wires 8a, and this connection electrode portion 8r is provided on the upper layer-side conductive pattern portion 7s and is in contact therewith. Accordingly, since a contact area between the end portions 8s of the auxiliary wires 8a and the upper layer-side conductive pattern portion 7s is large, the second electrode layer 9a can be reliably and electrically connected to the lower layer-side conductive pattern portion 6s through the auxiliary wires 8a without excessively increasing the area of the contact portion 115s; hence, the peripheral region 110c, which is located outside the pixel region 110a and which is not directly responsible for display, may have a small area.

Embodiment 3

Figure 8A:
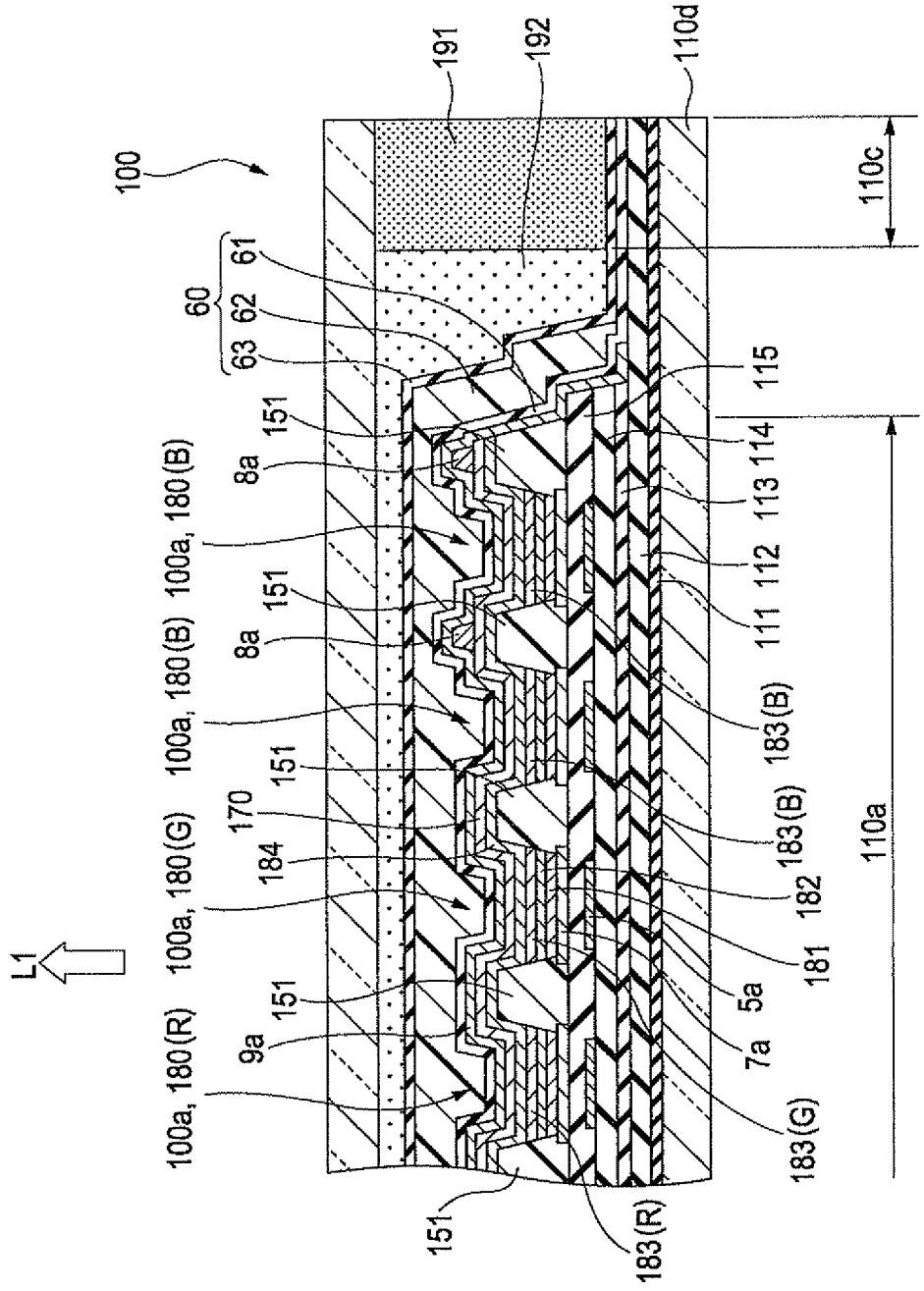
FIG. 8A is a schematic cross-sectional view of an organic EL device according to Embodiment 3 of the invention.
Figure 8B:
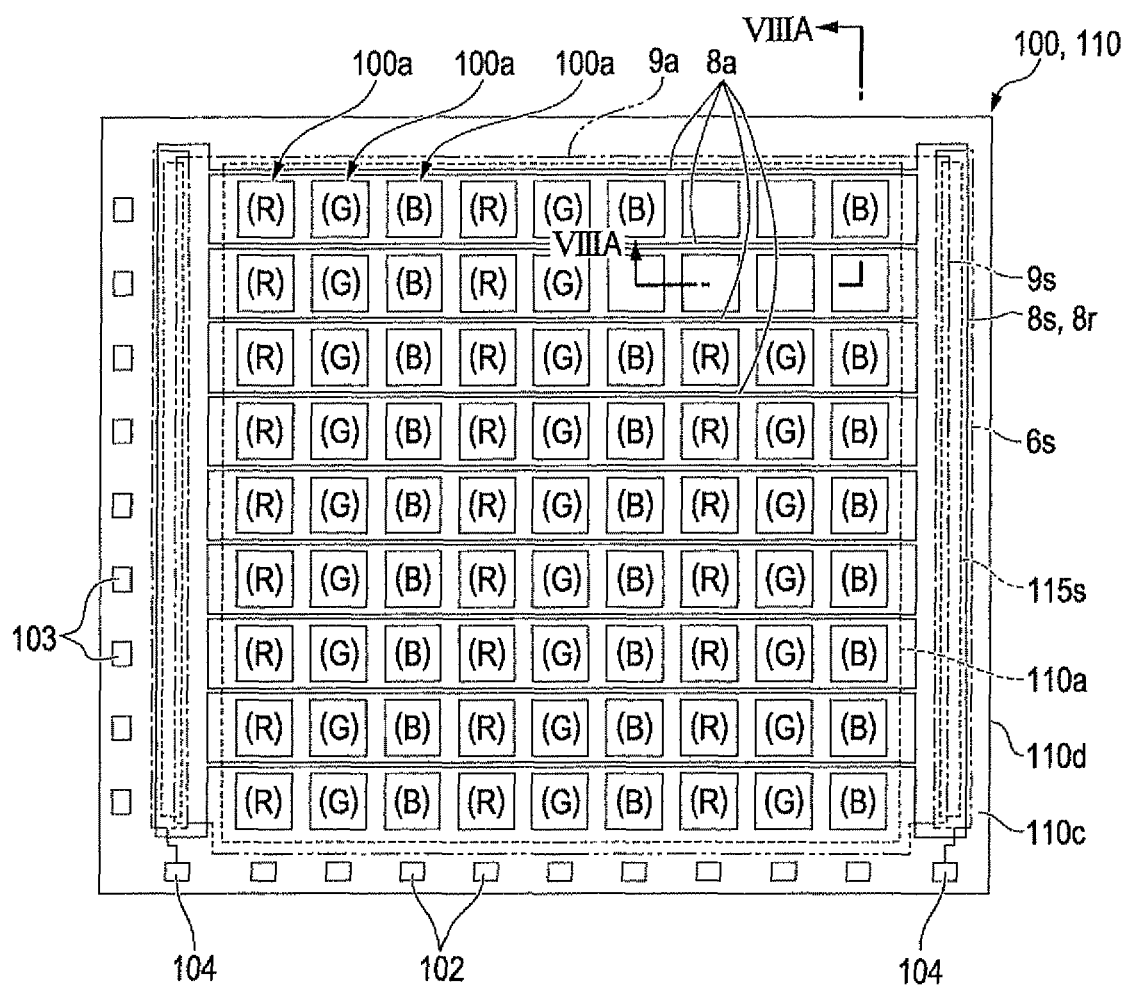
FIG. 8B is a schematic plan view of a first substrate of the organic EL device shown in FIG. 8A.
Figure 9A:
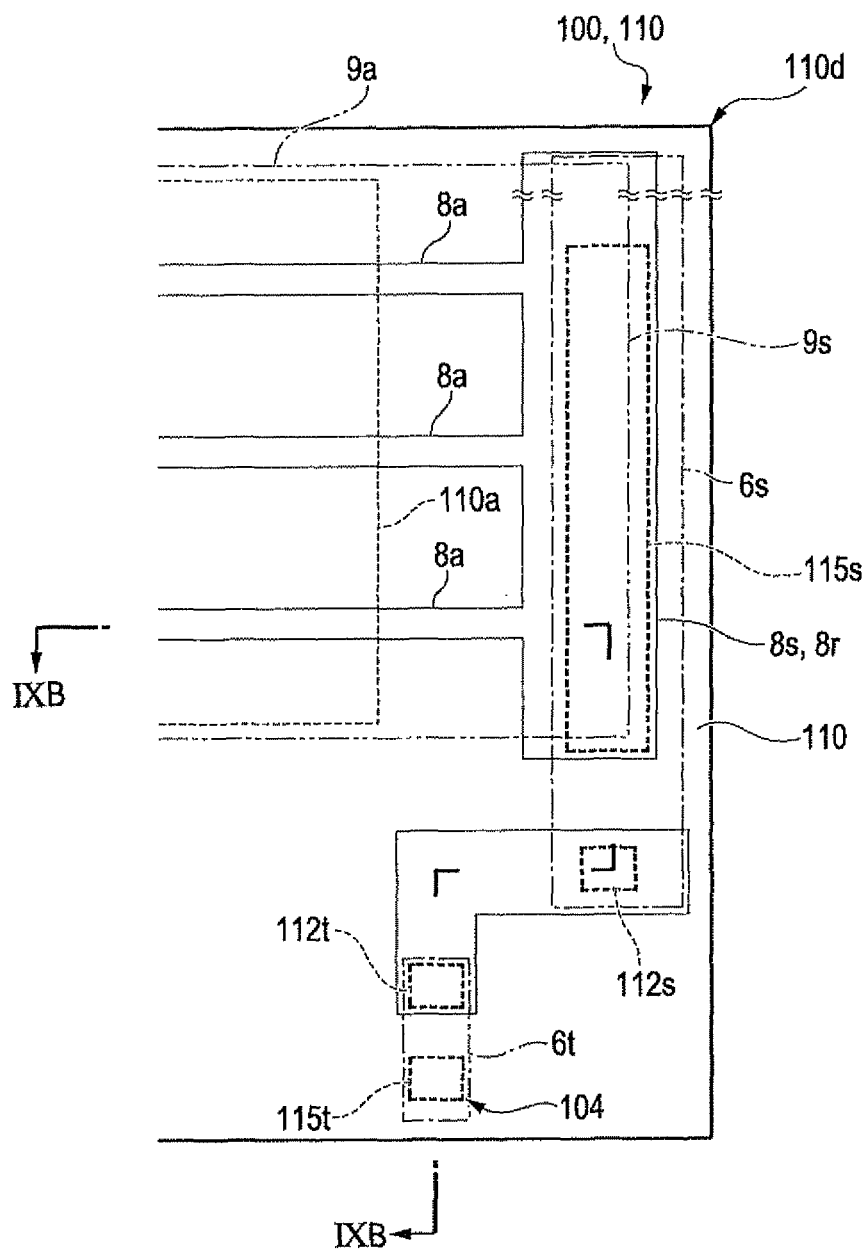
FIG. 9A is a schematic view illustrating a plan structure of an electrical connection portion between a terminal and auxiliary wires (second electrode layer) on the first substrate of the organic EL device according to Embodiment 3 of the invention.
Figure 9B:
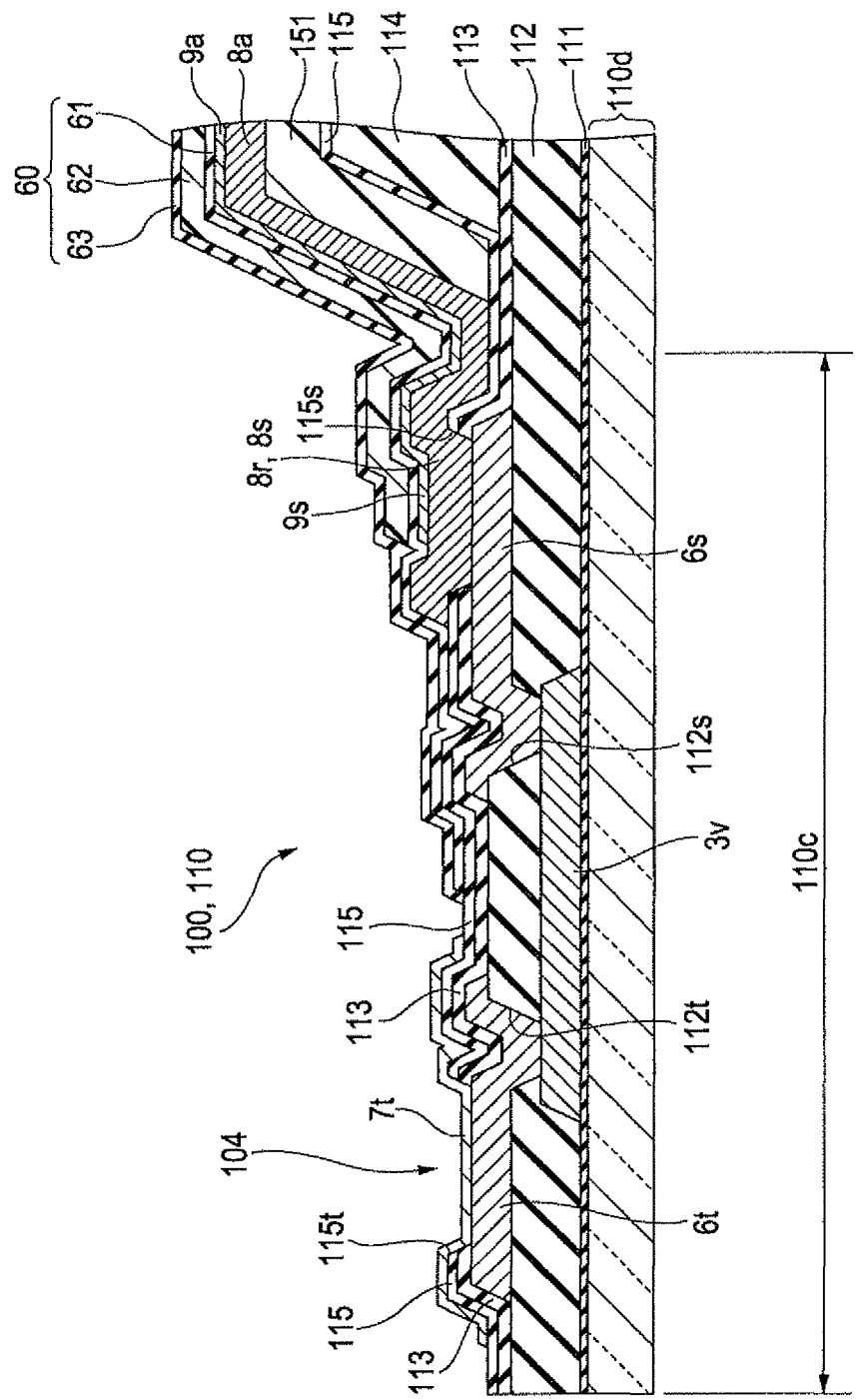
FIG. 9B is a cross-sectional view taken along the line IXB-IXB shown in FIG. 9A.

FIG. 8A is a schematic cross-sectional view of an organic EL device according to Embodiment 3 of the invention, and FIG. 8B is a schematic plan view of the first substrate 110 of the organic EL device shown in FIG. 8A, FIGS. 8A and 8B corresponding to FIGS. 3A and 3B, respectively, shown in Embodiment 1. FIG. 9A is a schematic view illustrating a plan structure of an electrical connection portion between a terminal and auxiliary wires (second electrode layer) on the first substrate 110 of the organic EL device according to Embodiment 3 of the invention, and FIG. 9B is a cross-sectional view taken along the line IXB-IXB shown in FIG. 9A, FIGS. 9A and 9B corresponding to FIGS. 5A and 5B, respectively, shown in Embodiment 1. Since the basic structure of this embodiment is similar to that of each of Embodiment 1 and 2, like elements are designated by the same reference numerals and a description thereof will be omitted.

As shown in FIGS. 8A, 8B, 9A, and 9B, also in the organic EL device 100 of this embodiment, as in Embodiment 1, above the support substrate 110d, a plurality of the auxiliary wires 8a extending in one direction is formed at a lower layer side of the second electrode layer 9a and is in direct contact therewith. In addition, also in this embodiment, as in Embodiment 1, when the auxiliary wires 8a are electrically connected to the terminal 104, in parts of the insulating films 113 and 115 which are flatly overlapped on the lower layer-side conductive pattern portion 6s, the contact portion 115s composed of a removed portion (non-forming region) of the insulating films 113 and 115 is formed, and this contact portion 115s is a large contact hole extending along the side of the pixel region 110a.

In the organic EL device 100 of this embodiment, as in Embodiment 2, the end portions 8s of the auxiliary wires 8a re connected to each other to form the solid connection electrode portion 8r having a width larger than that of each of the auxiliary wires 8a. Accordingly, in this embodiment, in a manner different from that of each of Embodiments 1 and 2, the wide connection electrode portion 8r of the auxiliary wires 8a is used as the contact pattern portion of the upper layer-side conductive pattern portion, and the upper layer-side conductive pattern portion 7s shown in FIGS. 5A, 5B, 7A and 7B is not formed. Hence, in this embodiment, the connection electrode portion 8r of the auxiliary wires 8a itself is provided on the lower layer-side conductive pattern portion 6s inside the contact portion 115s and is in contact with the lower layer-side conductive pattern portion Gs.

In addition, also in this embodiment, as in Embodiment 1, the second electrode layer 9a extends to the region forming the contact portion 115s. Hence, the end portion 9s of the second electrode layer 9a is provided on the upper surfaces of the end portions 8s (connection electrode portion 8r) of the auxiliary wires 8a in the region forming the contact portion 115s and outside the contact portion 115s and is in contact with the end portions 8s of the auxiliary wires 8a.

Also in this embodiment, as in Embodiment 1, at the upper layer side of the insulating film 115, the solid connection electrode portion 8r of the auxiliary wires 8a formed from a conductive film having a sheet resistance lower than that of the second electrode layer 9a is provided on the upper surface of the lower layer-side conductive pattern portion 6s inside and outside the contact portion 115s and is connected thereto. Hence, even when the contact portion 115s is narrow, the connection resistance between the lower layer-side conductive pattern portion 6s and the auxiliary wires 8a is low. Accordingly, since the second electrode layer 9a can be reliably and electrically connected to the lower layer-side conductive pattern portion 6s through the auxiliary wires 8a without excessively increasing the area of the contact portion 115s, the peripheral region 110c, which is located outside the pixel region 110a and which is not directly responsible for display, may have a small area.

Embodiment 4

Figure 10B:
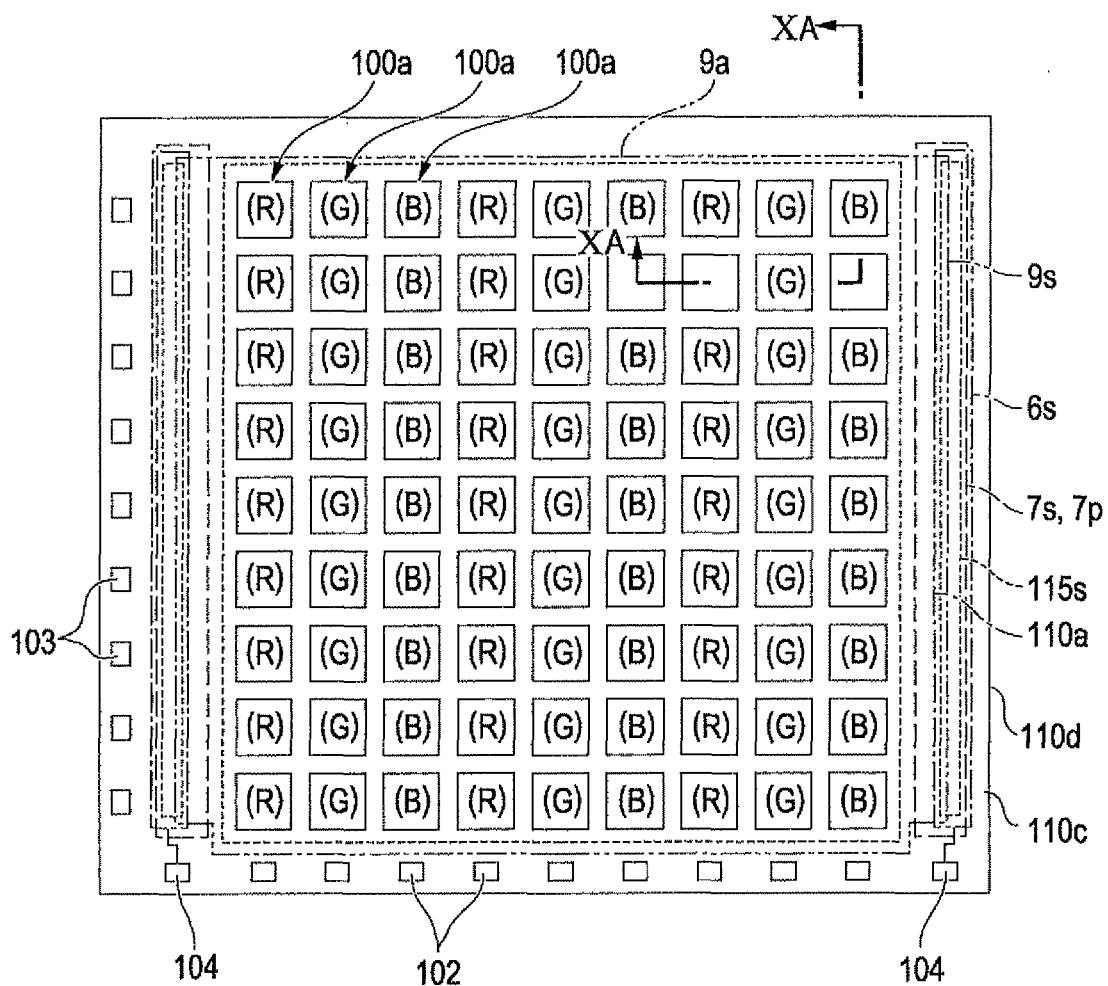
FIG. 10B is a schematic plan view of a first substrate of the organic EL device shown in FIG. 10A.
Figure 11A:
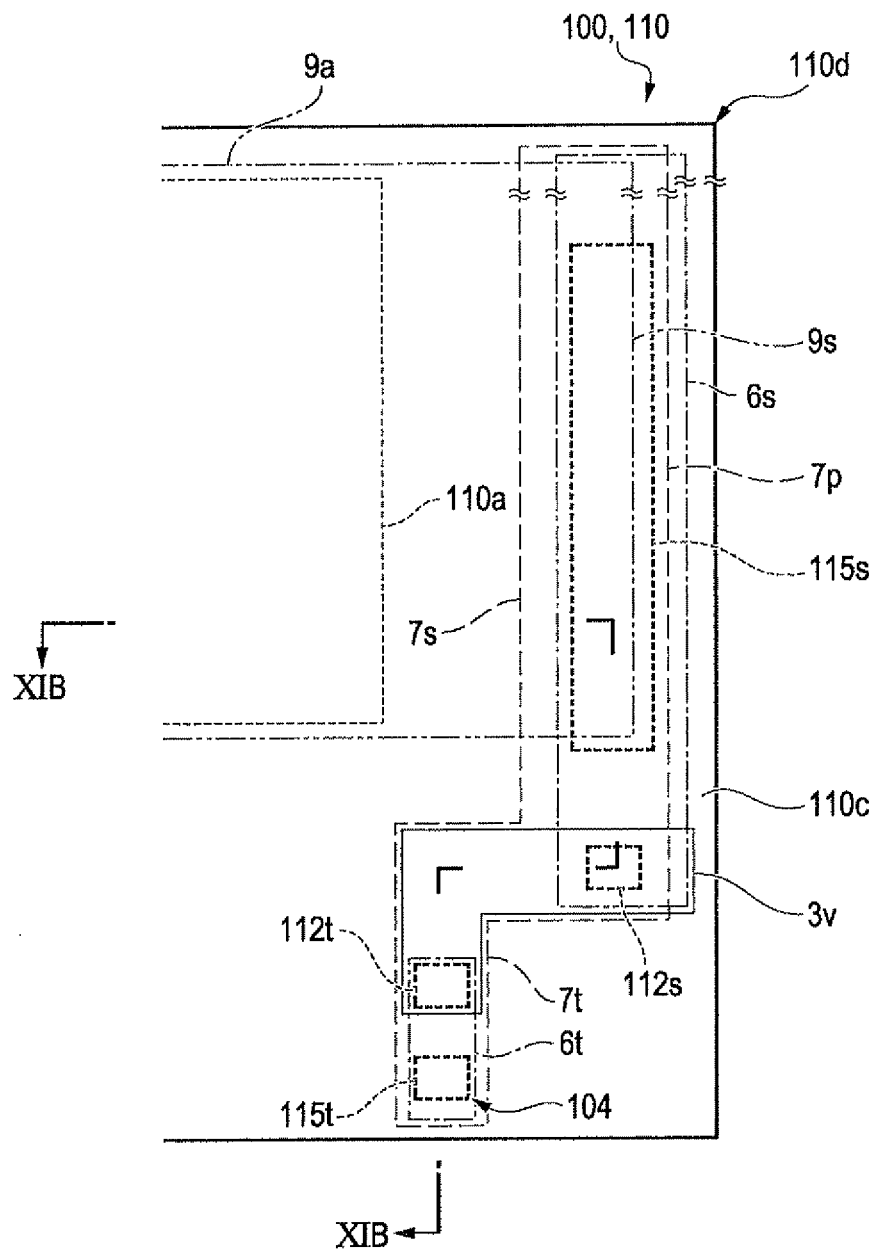
FIG. 11A is a schematic view illustrating a plan structure of an electrical connection portion between a terminal and auxiliary wires (second electrode layer) on the first substrate of the organic EL device according to Embodiment 4 of the invention.
Figure 11B:
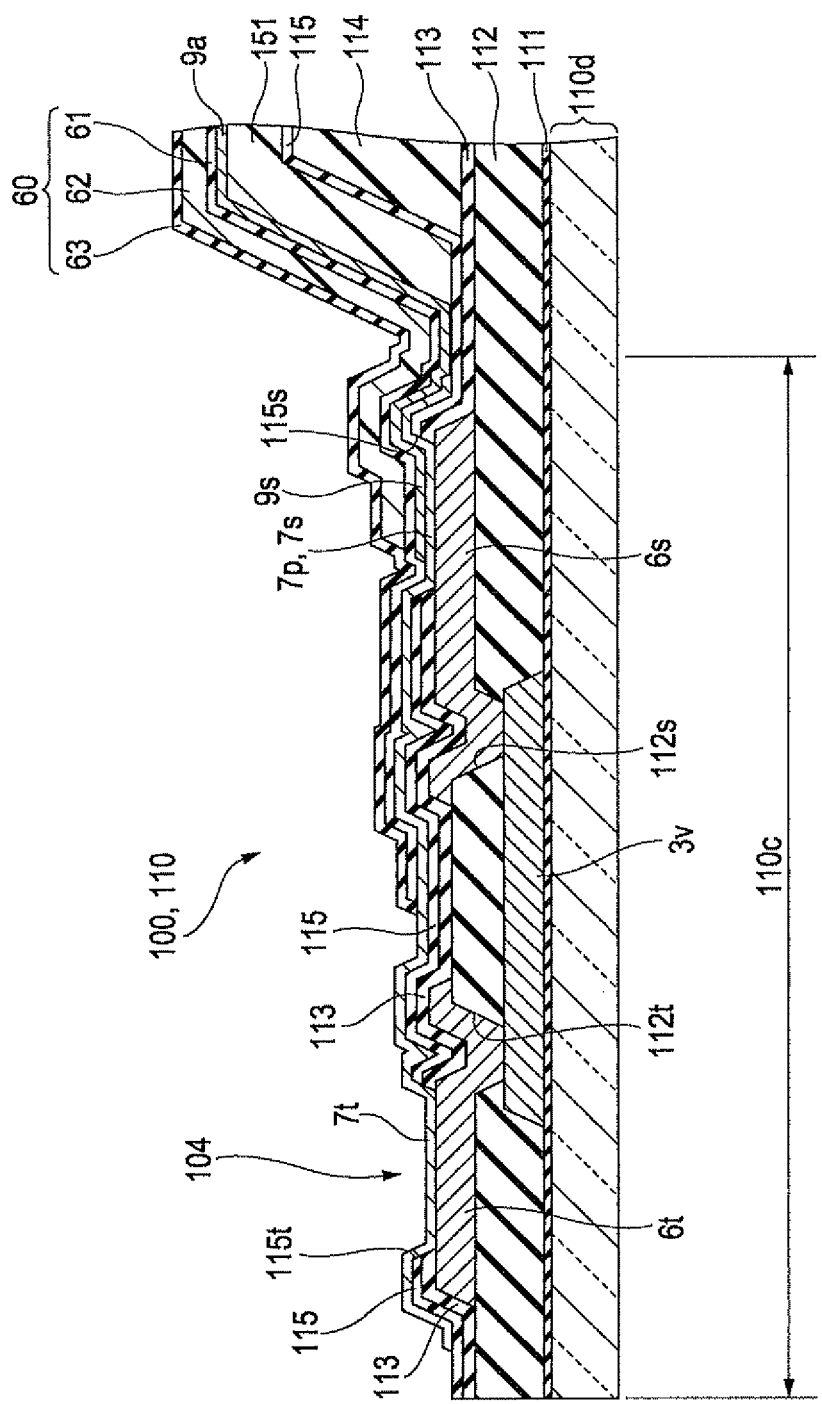
FIG. 11B is a cross-sectional view taken along the line XIB-XIB shown in FIG. 11A.

FIG. 10A is a schematic cross-sectional view of an organic EL device according to Embodiment 4 of the invention, and FIG. 10B is a schematic plan view of the first substrate 110 of the organic EL device shown in FIG. 10A, FIGS. 10A and 10B corresponding to FIGS. 3A and 3B, respectively, shown in Embodiment 1. FIG. 11A is a schematic view illustrating a plan structure of an electrical connection portion between a terminal and auxiliary wires (second electrode layer) on the first substrate 110 of the organic EL device according to Embodiment 4 of the invention, and FIG. 11B is a cross-sectional view taken along the line XIB-XIB shown in FIG. 11A, FIGS. 11A and 11B corresponding to FIGS. 5A and 5B, respectively, shown in Embodiment 1. Since the basic structure of this embodiment is similar to that of each of Embodiment 1 and 2, like elements are designated by the same reference numerals and a description thereof will be omitted.

As shown in FIGS. 10A, 10B, 11A, and 11B, in the organic EL device 100 of this embodiment, in a manner different from that of each of Embodiments 1 to 3, the auxiliary wires 8a are not formed. However, also in this embodiment, as in Embodiment 1, when the second electrode layer 9a is electrically connected to the terminal 104, in parts of the insulating films 113 and 115 which are flatly overlapped on the lower layer-side conductive pattern portion 6s, the contact portion 115s composed of a removed portion (non-forming region) of the insulating films 113 and 115 is formed, and this contact portion 115s is a large contact hole extending along the side of the pixel region 110a. Furthermore, also in this embodiment, as in Embodiment 1, the upper layer-side conductive pattern portion 7s having the contact pattern portion 7p is formed on the insulating film 115, and the contact pattern portion 7p of the upper layer-side conductive pattern portion 7s is provided on the upper surface of the lower layer-side conductive pattern portion 6s inside the contact portion 115s and is in contact with the lower layer-side conductive pattern portion 6s.

In the organic EL device 100 of this embodiment, the end portion 9s of the second electrode layer 9a is provided on the upper layer-side conductive pattern portion 7s inside the contact portion 115s and is in contact with the upper layer-side conductive pattern portion 7s. In addition, also at the upper layer side of the insulating film 115 (outside the contact portion 115s), the end portion 9s of the second electrode layer 9a is provided on the upper surface of the contact pattern portion 7p of the upper layer-side conductive pattern portion 7s in the region between the contact portion 115s and the pixel region 110a and is in contact with the upper layer-side conductive pattern portion 7s.

Hence, also in this embodiment, since the upper layer-side conductive pattern portion 7s for connecting the second electrode layer 9a to the lower layer-side conductive pattern portion 6s is formed from a conductive film having a sheet resistance lower than that of the second electrode layer 9a at the upper layer side of the insulating film 115, a potential can be applied to the second electrode layer 9a through the lower layer-side conductive pattern portion 6s and the upper layer-side conductive pattern portion 7s. In this embodiment, since the upper layer-side conductive pattern portion 7s has the contact pattern portion 7p which is provided on the upper surface of the lower layer-side conductive pattern portion 6s at the contact portion 115s, even when the contact portion 115s is narrow, the connection resistance between the lower layer-side conductive pattern portion 6s and the upper layer-side conductive pattern portion 7s is low. In addition, since the upper layer-side conductive pattern portion 7s is formed on the insulating film 115, the upper layer-side conductive pattern portion 7s can also be electrically connected to the second electrode layer 9a outside the contact portion 115s, and the structure in which the upper layer-side conductive pattern portion 7s and the second electrode layer 9a are in contact with each other in a sufficiently wide area can be realized. Accordingly, since the second electrode layer 9a can be reliably and electrically connected to the lower layer-side conductive pattern portion 6s without excessively increasing the area of the contact portion 115s, the peripheral region 110c, which is located outside the pixel region 110a and which is not directly responsible for display, may have a small area.

Other Embodiments

In the above Embodiments 1, 2, and 4, the upper layer-side conductive pattern portion 7s is simultaneously formed with the first electrode layer 7a; however, a conductive film formed in a step different from that for the first electrode layer 7a may be used as long as the conductive film has a sheet resistance lower than that of the second electrode layer 9a.

In the above Embodiments 1, 2, and 4, the structure is used in which the upper layer-side conductive pattern portion 7s is connected to the upper layer-side conductive film 7t forming the terminal 104; however, the structure in which the upper layer-side conductive pattern portion 7s and the upper layer-side conductive film 7t are separated from each other may also be used.

In the above Embodiments 1 to 4, the structure is used in which the lower layer-side conductive pattern portion 6s and the lower layer-side conductive film 6t are electrically connected to each other through the conductive film 3v; however, the structure in which the lower layer-side conductive pattern portion 6s itself extends from the contact portion 115s to the region forming the terminal 104 may also be used.

In the above Embodiments 1 to 3, the auxiliary wires 8a are formed at the lower layer side of the second electrode layer 9a; however, the aspect of the invention may be applied to an organic EL device in which the auxiliary wires 8a are formed at an upper layer side of the second electrode layer 9a.

In the above Embodiments 1 to 4, although the organic functional layers formed by a vacuum deposition method are primarily discussed, the aspect of the invention may also be applied to an organic EL device including organic functional layers formed by an ink jet method or the like. That is, when a hole injection layer of an organic EL element is formed, a method in which a liquid composition composed, for example, of 3,4-polyethylenedioxythiophene/polystyrene sulfonic acid (PEDOT/PSS) dissolved in a solvent is ejected in the form of dots and is then fixed may be used in some cases, and when the above method is used, the aspect of the invention may be applied thereto. In addition, when a light-emitting layer of an organic EL element is formed, a method may be used in some cases in which a liquid composition composed, for example, of a polyfluorene derivative, a polyphenylene derivative, a polyvinylcarbazole derivative, a polythiophene derivative, or one of the above polymeric materials doped with at least one of a perylene dye, a coumarin dye, or a rhodamine dye, such as rubrene, perylene, diphenylanthracene, tetraphenylbutadiene, Nile red, coumarin-6, or quinacridone, dissolved in a solvent is ejected in the form of dots and is then fixed, and when the above method is used, the aspect of the invention may be applied thereto.

In the above embodiments, as the organic EL device 100 of the invention, the top emission-type organic EL device is described; however, the aspect of the invention may also be applied to a bottom emission-type organic EL device.

Application Examples to Electronic Apparatuses

Figure 12A:
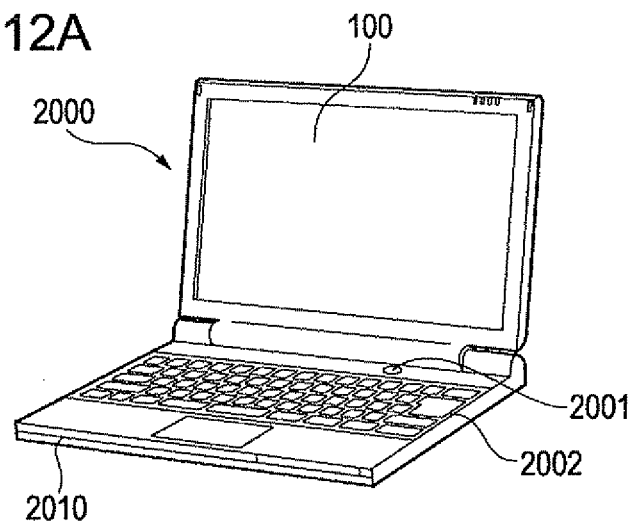
FIGS. 12A to 12C are perspective views each showing an electronic apparatus using an electro-optic device of an embodiment of the invention.
Figure 12B:
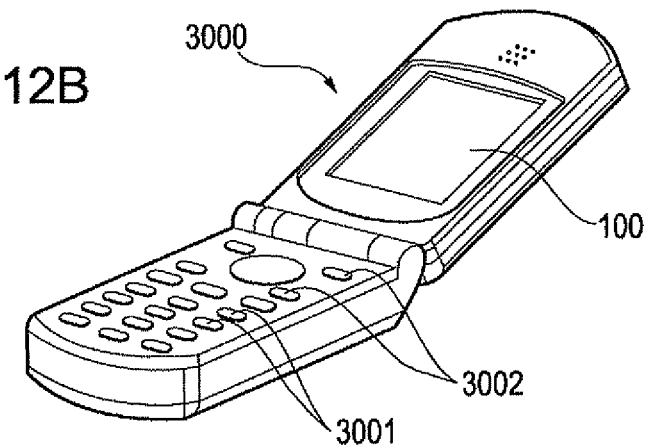
Figure 12C:
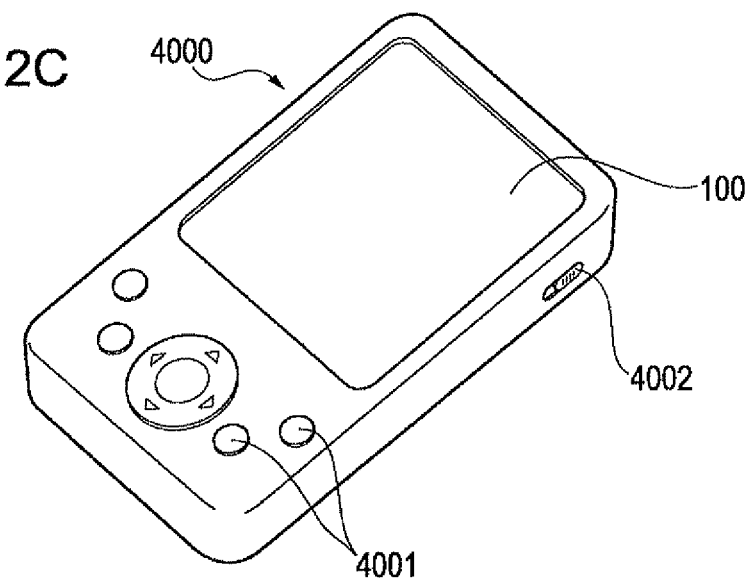

Next, electronic apparatuses including the organic EL devices 100 according to the above embodiments will be described. In FIG. 12A, the structure of a mobile personal computer including the organic EL device 100 is shown. A personal computer 2000 has the organic EL device 100 functioning as a display unit and a main frame 2010. The main frame 2010 has a power switch 2001 and a keyboard 2002. In FIG. 12B, the structure of a mobile phone including the organic EL device 100 is shown. A mobile phone 3000 has a plurality of operation buttons 3001, scroll buttons 3002, and the organic EL device 100 functioning as a display unit. When the scroll button 3002 is operated, an image displayed on the organic EL device 100 is scrolled. In FIG. 12C, the structure of a personal digital assistant (PDA) including the organic EL device 100 is shown. A personal digital assistant 4000 has a plurality of operation buttons 4001, a power switch 4002, and the organic EL device 100 functioning as a display unit. When the power switch 4002 is operated, various types of information, such as an address book and a schedule book, are displayed on the organic EL device 100.

As the electronic apparatuses each incorporating the organic EL device 100, besides those shown in FIGS. 12A to 12C, there may also be mentioned various apparatuses, such as a digital still camera, a liquid crystal television, a viewfinder type and a direct viewing type video tape recorder, a car navigation apparatus, a pager, an electronic notebook, an electronic calculator, a word processor, a workstation, a television phone, a POS terminal, and an apparatus including a touch panel. In addition, as the display portions of these various electronic apparatuses, the organic EL device 100 described above can be used.

The entire disclosure of Japanese Patent Application No. 2008-111021, filed Apr. 22, 2008 is expressly incorporated by reference herein.

What is claimed is:

1. An organic electroluminescent device comprising:
   a substrate that has an element region and a connection region outside of the element region;
   a light-emitting element that has a first electrode, a second electrode, a light-emitting layer disposed between the first electrode and the second electrode, the light-emitting element disposed in the element region;
   a first conductive film that is disposed in a first layer between the substrate and the second electrode;
   a second conductive film that is disposed in a second layer between the first layer and the second electrode, and
   an auxiliary wiring that extends from the element region to the connection region, wherein:
   the first conductive film and the second conductive film are disposed in the connection region;
   the second electrode extends from the element region to the connection region;
   the second electrode, the first conductive film and the second conductive film are electrically connected in the connection region; and
   in the connection region, the auxiliary wiring is electrically connected to the second electrode and the second conductive film and the auxiliary wiring is disposed between the second electrode and the second conductive film.

2. The organic electroluminescent device according to claim 1,
   wherein the first and second conductive films are arranged along a first side of the substrate.

3. The organic electroluminescent device according to claim 1, further comprising:
   an insulating layer arranged between the first and second layers;
   wherein the first and second conductive films are electrically connected through a contact portion arranged in the insulating layer.

4. The organic electroluminescent device according to claim 1,
   wherein the light-emitting element has first and second light-emitting elements, and in a plan view, the auxiliary wires are arranged between the first and second light-emitting elements.

* * * * *